United States Patent
Miyazaki et al.

(10) Patent No.: US 6,879,188 B2
(45) Date of Patent: Apr. 12, 2005

(54) SEMICONDUCTOR INTEGRATED CIRCUIT DEVICE

(75) Inventors: Masayuki Miyazaki, Tokyo (JP); Ken Tatezawa, Kodaira (JP); Kiwamu Takada, Kodaira (JP); Kunio Uchiyama, Kodaira (JP); Osamu Nishii, Inagi (JP); Kiyoshi Hasegawa, Fusa (JP); Hirokazu Aoki, Hachioji (JP); Masaru Kokubo, Hanno (JP)

(73) Assignees: Renesas Technology Corp., Tokyo (JP); Hitachi ULSI Systems Co., Ltd., Tokyo (JP)

( * ) Notice: Subject to any disclaimer, the term of this patent is extended or adjusted under 35 U.S.C. 154(b) by 0 days.

(21) Appl. No.: 10/322,594

(22) Filed: Dec. 19, 2002

(65) Prior Publication Data

US 2003/0098730 A1 May 29, 2003

Related U.S. Application Data

(63) Continuation of application No. 09/580,646, filed on May 30, 2000, now Pat. No. 6,515,519.

(30) Foreign Application Priority Data

May 27, 1999 (JP) .......................................... 11-147664

(51) Int. Cl.[7] .............................................. H03B 19/00
(52) U.S. Cl. ........................ 327/105; 327/99; 327/408; 327/158
(58) Field of Search ........................ 327/99, 105, 544, 327/145, 156, 158, 408

(56) References Cited

U.S. PATENT DOCUMENTS

| | | | |
|---|---|---|---|
| 4,659,999 A | * 4/1987 | Motoyama et al. ............. 331/2 |
| 5,095,280 A | 3/1992 | Wunner et al. ............. 327/145 |
| 5,414,308 A | * 5/1995 | Lee et al. .................... 327/293 |
| 5,463,351 A | * 10/1995 | Marko et al. ................ 331/1 A |
| 5,684,418 A | 11/1997 | Yanagiuchi ................... 327/99 |
| 5,757,212 A | * 5/1998 | Sevalia ........................ 327/105 |
| 5,774,701 A | * 6/1998 | Matsui et al. ................ 395/556 |
| 5,987,010 A | * 11/1999 | Schnizlein ................... 370/280 |
| 6,130,552 A | * 10/2000 | Jefferson et al. .............. 326/39 |
| 6,172,537 B1 | 1/2001 | Kanou et al. .................. 327/99 |
| 6,263,448 B1 | 7/2001 | Tsern et al. ................... 713/501 |

OTHER PUBLICATIONS

"Hitachi SuperH RISC Engine SH7750 Hardware Manual", pp. 10–15 to 10–15, published in Apr. 1998.
Lee et al. "A 250MHz Low Jitter Adaptive Bandwidth PLL", 1999 IEEE Int'l Solid–State Circuits Conference, Digest of Technical Papers, pp. 346–347, 1999.

* cited by examiner

*Primary Examiner*—Dinh T. Le
(74) *Attorney, Agent, or Firm*—Antonelli, Terry, Stout & Kraus, LLP

(57) ABSTRACT

A semiconductor integrated circuit device employing two clock signal generating circuits which output clock signals for distribution to an internal circuit of the device, the first and second clock signal generating circuits having different clock-settling times and the selection thereof is effected from outside of the device. A first one of the clock signal generating circuits uses, for example, a phase-locked loop circuit which has a large clock-settling time, and the second clock signal generating circuit is implemented, for example, using a delay-locked loop circuit whose clock-settling time is small, for example, 2–3 periods. Due to the selective actuation of the second clock signal generating circuit, which has a small clock-settling time, the generating of clock signals for the internal circuits can also be halted when the internal circuits of the device are halted thereby to further lower power consumption without compromising clock oscillator responsiveness.

6 Claims, 22 Drawing Sheets

FRQCR

| bit | 15 | 14 | 13 | 12 | 11 | 10 | 9 | 8 |
|---|---|---|---|---|---|---|---|---|
| | — | — | CK0EN | PLL1EN | PLL2EN | DLL1EN | DLL2EN | IFC2 |
| initial value | 0 | 0 | 1 | 1 | 1 | 0 | 0 | 0 |
| Read/Wright (R/W) | R | R | R/W | R/W | R/W | R/W | R/W | R/W |

| bit | 7 | 6 | 5 | 4 | 3 | 2 | 1 | 0 |
|---|---|---|---|---|---|---|---|---|
| | IFC1 | IFC0 | BFC2 | BFC1 | BFC0 | PFC2 | PFC1 | PFC0 |
| initial value | 0 | 0 | 0 | 0 | 0 | 0 | 0 | 0 |
| Read/Wright (R/W) | R/W | R/W | R/W | R/W | R/W | R/W | R/W | R/W |

FIG.17

FRQCR

| bit | 15 | 14 | 13 | 12 | 11 | 10 | 9 | 8 |
|---|---|---|---|---|---|---|---|---|
| | — | — | CK0EN | PLL1EN | PLL2EN | DLL1EN | DLL2EN | IFC2 |
| initial value | 0 | 0 | 1 | 1 | 1 | 0 | 0 | — |
| Read/Wright (R/W) | R | R | R/W | R/W | R/W | R/W | R/W | R/W |

| bit | 7 | 6 | 5 | 4 | 3 | 2 | 1 | 0 |
|---|---|---|---|---|---|---|---|---|
| | IFC1 | IFC0 | BFC2 | BFC1 | BFC0 | PFC2 | PFC1 | PFC0 |
| initial value | — | — | — | — | — | — | — | — |
| Read/Wright (R/W) | R/W | R/W | R/W | R/W | R/W | R/W | R/W | R/W |

FIG.18

FRQCR1

| bit | 15 | 14 | 13 | 12 | 11 | 10 | 9 | 8 |
|---|---|---|---|---|---|---|---|---|
| | — | — | — | — | CK0EN | PLL1EN | PLL2EN | IFC2 |
| initial value | 0 | 0 | 0 | 0 | 1 | 1 | 1 | — |
| Read/Wright (R/W) | R | R | R | R | R/W | R/W | R/W | R/W |

| bit | 7 | 6 | 5 | 4 | 3 | 2 | 1 | 0 |
|---|---|---|---|---|---|---|---|---|
| | IFC1 | IFC0 | BFC2 | BFC1 | BFC0 | PFC2 | PFC1 | PFC0 |
| initial value | — | — | — | — | — | — | — | — |
| Read/Wright (R/W) | R/W | R/W | R/W | R/W | R/W | R/W | R/W | R/W |

FRQCR2

| bit | 15 | 14 | 13 | 12 | 11 | 10 | 9 | 8 |
|---|---|---|---|---|---|---|---|---|
| | — | — | — | — | — | DLL1EN | DLL2EN | — |
| initial value | 0 | 0 | 0 | 0 | 0 | 0 | 0 | 0 |
| Read/Wright (R/W) | R | R | R | R | R | R/W | R/W | R |

| bit | 7 | 6 | 5 | 4 | 3 | 2 | 1 | 0 |
|---|---|---|---|---|---|---|---|---|
| | — | — | — | — | — | — | — | — |
| initial value | 0 | 0 | 0 | 0 | 0 | 0 | 0 | 0 |
| Read/Wright (R/W) | R | R | R | R | R | R | R | R |

FIG.19

IFC

| IFC2 | IFC1 | IFC0 | division ratio |
|---|---|---|---|
| 0 | 0 | 0 | ×1 |
| 0 | 0 | 1 | ×1/2 |
| 0 | 1 | 0 | ×1/3 |
| 0 | 1 | 1 | ×1/4 |
| 1 | 0 | 0 | ×1/6 |
| 1 | 0 | 1 | ×1/8 |

FIG.20

BFC

| BFC2 | BFC1 | BFC0 | division ratio |
|---|---|---|---|
| 0 | 0 | 0 | ×1 |
| 0 | 0 | 1 | ×1/2 |
| 0 | 1 | 0 | ×1/3 |
| 0 | 1 | 1 | ×1/4 |
| 1 | 0 | 0 | ×1/6 |
| 1 | 0 | 1 | ×1/8 |

FIG.21

PFC

| PFC2 | PFC1 | PFC0 | division ratio |
|---|---|---|---|
| 0 | 0 | 0 | ×1 |
| 0 | 0 | 1 | ×1/2 |
| 0 | 1 | 0 | ×1/3 |
| 0 | 1 | 1 | ×1/4 |
| 1 | 0 | 0 | ×1/6 |
| 1 | 0 | 1 | ×1/8 |

FIG.22

| mode terminal mod 1 mod 2 mod 3 | | | DIV 1 | PLL 1 | PLL 2 | DLL | clk 1 | clk 2 | clk 3 | clkinput (MHz) |
|---|---|---|---|---|---|---|---|---|---|---|
| 0 | 0 | 0 | off | on | on | off | ×6 | ×3/2 | ×3/2 | 17–33 |
| 0 | 0 | 1 | off | on | on | off | ×6 | ×1 | ×1 | 25–33 |
| 0 | 1 | 0 | on | on | on | off | ×3 | ×1 | ×1/2 | 25–66 |
| 0 | 1 | 1 | off | on | on | off | ×6 | ×2 | ×1 | 13–33 |
| 1 | 0 | 0 | on | on | on | off | ×3 | ×3/2 | ×3/4 | 17–66 |
| 1 | 0 | 1 | off | on | on | off | ×6 | ×3 | ×3/2 | 9–33 |

FIG.23

TMCR

| bit | 7 | 6 | 5 | 4 | 3 | 2 | 1 | 0 |
|---|---|---|---|---|---|---|---|---|
|  | TME | — | — | — | TOVF | CKS2 | CKS1 | CKS0 |
| initial value | 0 | 0 | 0 | 0 | 0 | 0 | 0 | 0 |
| Read/Wright (R/W) | R/W | R/W | R/W | R/W | R/W | R/W | R/W | R/W |

FIG.24

TMCNT

| bit | 7 | 6 | 5 | 4 | 3 | 2 | 1 | 0 |
|---|---|---|---|---|---|---|---|---|
|  |  |  |  |  |  |  |  |  |
| initial value | 0 | 0 | 0 | 0 | 0 | 0 | 0 | 0 |
| Read/Wright (R/W) | R/W | R/W | R/W | R/W | R/W | R/W | R/W | R/W |

| STBCR bit | 7 | 6 | 5 | 4 | 3 | 2 | 1 | 0 |
|---|---|---|---|---|---|---|---|---|
| | — | — | — | — | — | — | SLP | STB |
| initial value | 0 | 0 | 0 | 0 | 0 | 0 | 0 | 0 |
| Read/Wright (R/W) | R | R | R | R | R | R | R/W | R/W |

SEMICONDUCTOR INTEGRATED CIRCUIT DEVICE

CROSS-REFERENCE TO RELATED APPLICATION

This application is a Continuation application of U.S. application Ser. No. 09/580,646, filed May 30, 2000 now U.S. Pat. No. 6,515,519, the subject matter of which is incorporated by reference herein.

BACKGROUND OF THE INVENTION

1. Field of the Invention

This invention relates to a semiconductor integrated circuit device, and in particular to a semiconductor integrated circuit device which generates and distributes a synchronous clock signal.

2. Description of the Related Art

In LSI for microprocessors using a CMOS circuit, a clock signal is distributed to an internal CMOS circuit, and operations are performed according to the timing of the clock signal. In general, a phase-locked loop (PLL) is built into the LSI as a circuit for generating the clock signal. The clock signal is generated by a crystal oscillator circuit, etc., outside the LSI. The signal is then input to the LSI, the PLL performs frequency multiplication and phase synchronization, and the clock signal is distributed to the LSI internal circuit.

One example of a microprocessor using a PLL is the system described in "Hitachi SuperH RISC engine SH7750 Hardware Manual" pp. 10–15, published in April 1998. A block diagram of this prior art example is shown in FIG. 28. The clock signal generated by the crystal oscillator circuit is input from terminals xtal and extal of an oscillator OSC, divided by a frequency divider D1V1, and transmitted to a PLL PLL1. In the PLL PLL1, the frequency of the input clock signal is multiplied by a factor of, e.g., 6 times, and is output. This multiplied clock signal is shaped into clock signals of desired frequencies through a frequency divider DIV2, and is distributed to the LSI internal circuit as plural clock signals. These clock signals are further supplied to a PLL PLL2, phase-synchronized, and output to the exterior of the LSI from a terminal ckio.

A prior art example of a PLL is shown in FIG. 26. An input clock signal clkin and output clock signal clkout which have been divided by a frequency divider DIV00 are input to a phase frequency detector PFD, and their frequency difference and phase difference are detected. The detected frequency difference and phase difference are converted into a control voltage by a charge pump CP and low pass filter circuit LPF, and are used as a control signal of a voltage control oscillator circuit VCO. The voltage control oscillator circuit VCO outputs a clock signal as the output clock signal clkout according to the control voltage, and feeds it back to the phase frequency detector PFD through the frequency divider DIV00. By repeating this process, the PLL generates the output clock signal clkout which is phase-synchronized with the input clock signal clkin and having a multiplied frequency. The time until the clock signal output by the PLL can be supplied stably with the desired phase and frequency is referred to as the clock settling time. For example, in the example described on pp. 346 to 347 of the 1999 IEEE International Solid-State Circuits Conference Digest of Technical Papers (February 1999), the clock settling time of the PLL is 40 periods of the clock signal.

In CMOS LSI used in microprocessors for portable devices in recent years, attempts are being made to reduce power consumption by such means as suspending supply of the clock signal to the circuit when the LSI internal circuit is not operating. Such an LSI has three kinds of states. One is an active state which performs normal operation. The second state is a sleep state where only the clock generating circuit is operating, the internal circuit is halted and the clock is not supplied to the internal circuit. The third state is a standby state where all circuits in the LSI are halted. In the standby state, the clock generating circuit is also stopped, and when the state changes from standby to active, the internal circuit cannot start operating and a fast return to the active state cannot be performed until the clock signal generated by the clock generating circuit stabilizes, i.e., during the clock stability period. Hence, in the sleep state, only the internal circuit is stopped and the clock generating circuit is made to function. When there is a state change from the sleep state to the active state, as the clock signal can be supplied stably, there is a fast return to the active state. However, the power consumption is larger than in the standby state due to operation of the clock generating circuit. The reason why a fast return to the active state from the standby state is not possible, is that the clock settling time of the PLL which is the clock generating circuit, is 40 periods of the clock signal, as described on p. 346 to p. 347 of the 1999 IEEE International Solid-State Circuit Conference Digest of Technical Papers (February 1999). If a clock generating circuit having a short clock settling time of 2–3 periods can be used for the clock generating circuit in a microprocessor, a fast return to the active state would be possible even if operation of the clock generating circuit stops in the sleep state.

SUMMARY OF THE INVENTION

It is therefore an object of this invention to provide a semiconductor integrated circuit device comprising a clock generating circuit having a short clock settling time, thereby resolving the above-mentioned problem.

This invention therefore provides a semiconductor integrated circuit device comprising plural clock generating circuits. As the clock settling time of the clock generating circuits is as short as 2–3 periods, the clock generating circuits stop simultaneously when the internal CMOS circuit of the semiconductor integrated circuit device stops, thereby reducing power consumption, and the internal CMOS circuit can be returned to the normal operating state from the idle state at high speed.

To resolve the above-mentioned problem, the main features of this invention are as follows.

The oscillator circuit inside the CMOS LSI circuit comprises a crystal oscillator, selectors, frequency dividers, and a phase-locked loop (PLL) and delay-locked loop (DLL).

An oscillator OSC comprises a terminal which receives a signal from outside the LSI. The signal input to this terminal is input to the crystal oscillator. The clock signal output of the crystal oscillator and the external clock signal directly applied from the terminal are selected by the selector. The output selection of the selector is also performed by a terminal. Next, the clock signal is divided by a frequency divider. Whether the clock signal is transmitted directly or whether the division output signal of the frequency divider is transmitted, is selected by a selector. Next, the clock signal is supplied as a reference signal to the PLL and DLL, and synchronized clock signals are respectively generated. Whether the clock signal is transmitted directly, or whether the clock signal output by the PLL or the clock signal output by the DLL is transmitted, is selected by a selector. The clock signal is then divided by a frequency divider, and distributed to the LSI as clock signals. The signal divided by the frequency divider is obtained as clock signals of desired frequencies by plural selectors, and clock signals having plural, different frequencies are supplied to the LSI.

According to another embodiment of this invention, a clock control circuit in a CMOS LSI circuit comprises a crystal oscillator, selectors, frequency dividers, PLL and DLL, and a clock control circuit in a CMOS LSI circuit comprises a frequency control register and bus interface.

The oscillator has the same construction as that of the above-mentioned circuit. The clock control circuit receives a clock control command from the internal bus of the LSI circuit, a frequency control signal is output to determine the output selection of a selector in the oscillator, and the PLL or DLL and division ratio of the frequency divider are selected. In the clock control circuit, the bus interface decodes the clock control command from the internal bus, and the frequency control register is rewritten. A frequency control signal is output according to the setting of the frequency control register, and a selector of the oscillator is selected.

According to another embodiment of this invention, a clock control circuit inside a CMOS LSI circuit comprises a crystal oscillator, selectors, frequency dividers, PLL and DLL, and a clock control circuit inside the CMOS LSI circuit comprises a frequency control register.

The oscillator has the same construction as that of the above-mentioned circuit. The clock control circuit has at least one mode terminal which receives a signal from outside the LSI circuit. A frequency control register is determined by the input signal of the mode terminal. An output is generated according to the frequency control register setting.

According to another embodiment of this invention, an oscillator inside a CMOS LSI circuit comprises a crystal oscillator, selectors, frequency dividers, PLL and DLL.

The oscillator OSC has a terminal which receives a signal from outside the LSI, and the signal input to the terminal is input to a crystal oscillator. The clock signal output of the crystal oscillator and an external clock signal directly supplied from the terminal are selected by a selector. The selection of the selector is performed by an external signal input to the terminal. Next, the clock signal is divided by a frequency divider. Whether the clock signal is transmitted directly or whether the division output signal of the frequency divider is transmitted, is selected by a selector. Next, the clock signal is supplied as a reference signal to the PLL and DLL, and synchronized clock signals are respectively generated. Whether the clock signal is transmitted directly, or whether the clock signal output by the PLL or the clock signal output by the DLL is transmitted, is selected by a selector. The clock signal selected here is divided by the frequency divider, and distributed to the LSI as clock signals. The signal divided by the frequency divider is obtained as clock signals of desired frequencies by-plural selectors, and clock signals having plural, different frequencies are thus supplied to the LSI. One of the clock signals supplied to the LSI is also supplied as a reference signal to the PLL and DLL, and synchronized clock signals are respectively generated. Whether the clock signal is transmitted directly, or whether the clock signal output by the PLL or the clock signal output by the DLL is transmitted, is selected by a selector. The clock signal selected here is output from a terminal to outside the LSI circuit.

According to another embodiment of this invention, an oscillator circuit, clock control circuit and timer circuit are provided inside a CMOS LSI circuit. The oscillator has the same construction as the above-mentioned circuit. The oscillator inputs a signal from outside via a terminal, inputs a frequency control signal and a clock standby signal from the clock control circuit, outputs a system clock signal to outside the LSI circuit using a terminal, and outputs one or more clock signals to the LSI circuit. The clock control circuit has one or more mode terminals, inputs a mode control signal from outside, inputs an interrupt signal, reset signal and standby enable signal from the LSI circuit, receives a control command from an internal bus, inputs a standby cancel signal from the timer circuit, and outputs a frequency control signal and clock standby signal to the oscillator and timer circuit. The timer circuit receives a control command from the internal bus, inputs the clock signal from the oscillator, inputs the frequency control signal and clock standby signal from the clock control circuit, and outputs the standby cancel signal to the LSI circuit to the clock control circuit.

BRIEF DESCRIPTION OF THE DRAWINGS

FIG. 17 is a drawing showing another setting of the frequency control register.

FIG. 18 is a drawing showing another setting of the frequency control register.

FIG. 19 is a bit setting diagram in the frequency control register.

FIG. 20 is another bit setting diagram in the frequency control register.

FIG. 21 is another bit setting diagram in the frequency control register.

FIG. 22 is a setting diagram of a mode terminal.

FIG. 23 is a drawing showing a setting of a timer control register.

FIG. 24 is a drawing showing a setting of a timer counter.

DETAILED DESCRIPTION OF THE PREFERRED EMBODIMENTS

Figure 1:
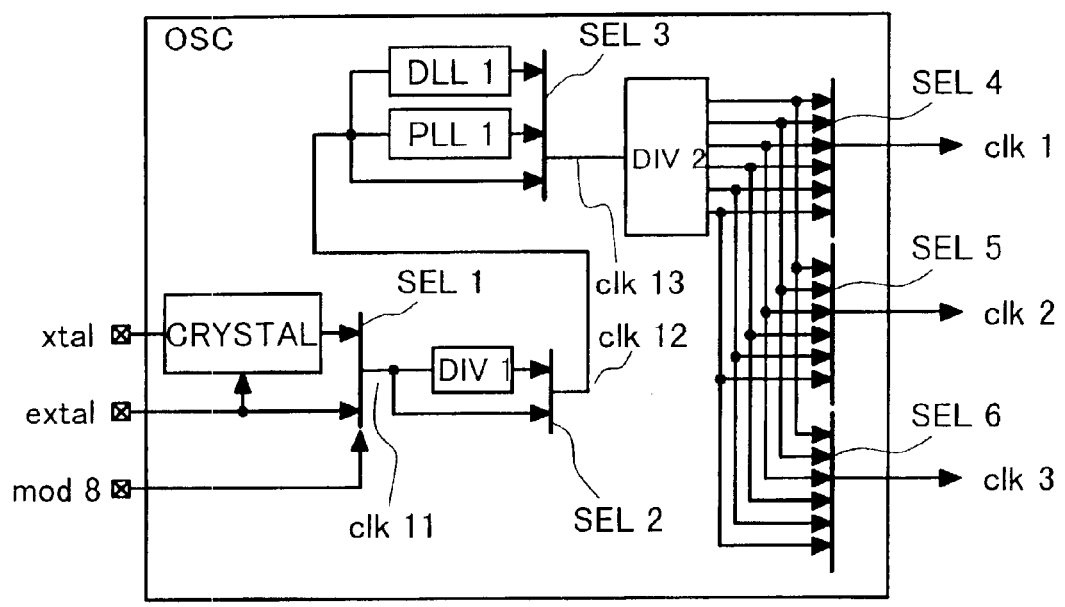
FIG. 1 is a block diagram of a semiconductor integrated circuit according to this invention.

Hereafter, embodiments of this invention will be described referring to the drawings.

FIG. 1 is a drawing showing one embodiment of this invention.

An oscillator OSC in a CMOS LSI circuit comprises a crystal oscillator CRYSTAL, selectors SEL1, SEL2, SEL3, SEL4, SEL5, SEL6, frequency dividers DIV1, DIV2, a phase-locked loop (PLL) PLL1 and a delay-locked loop (DLL) DLL1.

xta1, exta1 and mod8 are terminals in the oscillator OSC which receive signals from outside a LSI, and xta1 and exta1 are input to the crystal oscillator CRYSTAL. Signals from the clock signal output of the crystal oscillator CRYSTAL and the terminal exta1 are selected by the selector SEL1, and a clock signal clk11 is output. The selection of the selector SEL1 is performed by the terminal mod8. The clock signal clk11 is divided by the frequency divider DIV1. The clock signal clk11 and the division output signal of the frequency divider DIV1 are selected by the selector SEL2, and a clock signal clk12 is output. The clock signal clk12 is supplied as a reference signal to the PLL PLL1 and DLL DLL1, and synchronized clock signals are respectively generated. The selector SEL3 selects one of the clock signal clk12, clock signal output by the PLL PLL1, and clock signal output by the DLL DLL1. The clock signal selected here is divided by the frequency divider DIV2, and is distributed to the LSI as clock signals. The signal divided by the frequency divider DIV2 is obtained as clock signals of desired frequencies by the plural selector circuits SEL4, SEL5, SEL6, and plural clock signals of different frequencies, i.e., the clock signals clk1, clk2, clk3, are thus supplied to the LSI.

Figures 25, 26:
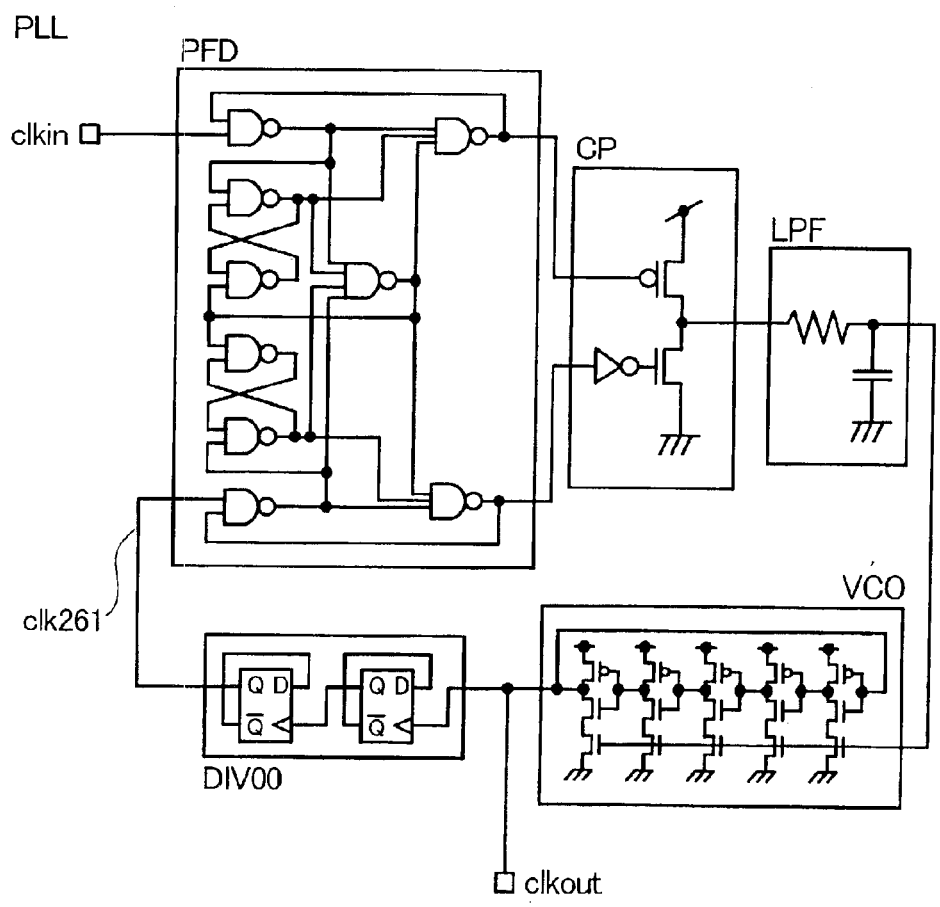
FIG. 25 is a drawing showing a setting of a standby control register.
FIG. 26 is a block diagram of a prior art example of a PLL.
Figure 27:
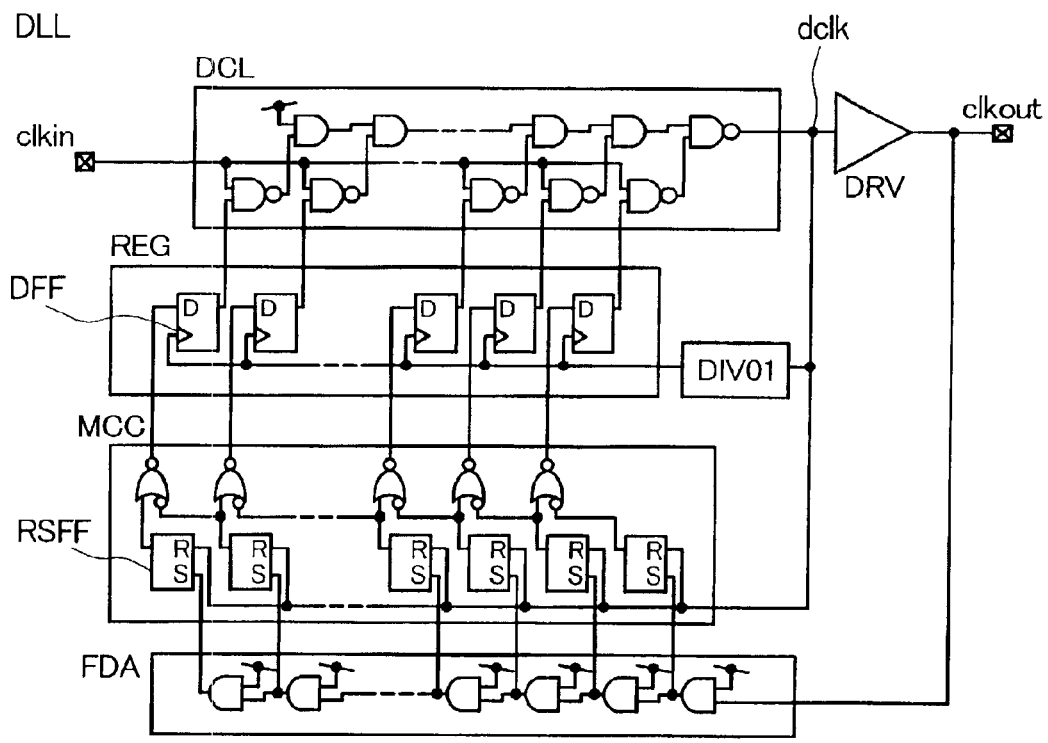
FIG. 27 is a block diagram of an example of a DLL.
Figure 28:
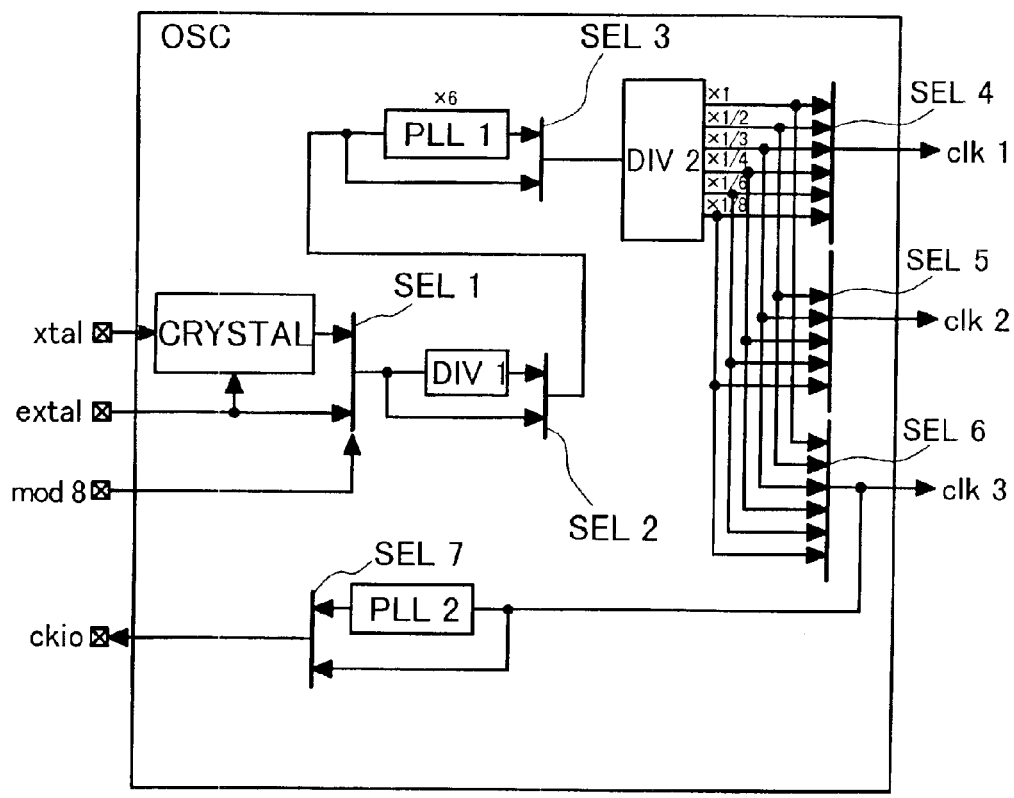
FIG. 28 is a block diagram of a semiconductor integrated circuit of a prior art example.

When a crystal resonator is used as a reference clock from outside the LSI, the output signal from the crystal resonator is applied to the terminals xta1, exta1, and waveform regulation is performed by the crystal oscillator CRYSTAL. When a clock signal is directly supplied from outside, a signal is supplied from the terminal exta1. The selection of the signal from the crystal resonator and the external clock signal is performed by the selector SEL1. Control of the selector SEL1 is performed by the mode terminal mod8. For example, when the terminal mod8 is High (1), the signal of the crystal resonator is acquired by the oscillator OSC as a reference signal, and when the terminal mod8 is Low (0), an external clock signal is acquired by the oscillator OSC as a reference signal. The two kinds of input signal can be freely changed over using the mode terminal mod8. The clock signal clk11 selected by the selector SEL1 is divided in clock frequency by the frequency divider DIV1. The selector SEL2 selects whether to directly transmit the clock signal clk11 or to divide it and transmit it. The clock signal clk12 selected by the selector SEL2 is supplied to the PLL PLL1 and DLL DLL1 as a reference signal. The PLL can output a clock signal obtained by multiplying the frequency of the reference clock, but at least 40 periods of the input clock signal are required for the clock settling time until the clock frequency and phase stabilize at the desired values. The DLL can output a clock signal of the same frequency as the reference clock with synchronized phase, but it cannot multiply the frequency. Also, the DLL requires only about 2–3 periods of the input clock signal for the clock settling time. Examples of the PLL and DLL are shown in FIG. 26 and FIG. 27. Their operation will be described later. The selector SEL3 transmits the clock signal clk12 directly without passing through the clock generating circuit, or, selects the clock signal output by the PLL PLL1 or the clock signal output by the DLL DLL1 and outputs a clock signal clk13. When phase error does not pose a problem and the external clock signal is input to the LSI as it is, the selector SEL3 transmits the signal directly. When the external clock signal input is multiplied and supplied to the LSI, the output signal from the PLL PLL1 is selected. When multiplication is not performed on the external clock signal and only the division signal is supplied to the LSI, the output of the DLL DLL1 is selected. The clock signal clk13 is further divided in frequency by the frequency divider DIV2, desired frequencies are selected by the selector circuits SEL4, SEL5, SEL6, and the plural clock signals clk1, clk2, clk3 are thus supplied to the LSI. By suitably combining the frequency dividers DIV1, DIV2 and the selectors SEL2, SEL4, SEL5, SEL6, clock signals having various frequencies can be generated and distributed to the LSI.

When a CMOS LSI circuit comprising the oscillator OSC supplies a clock signal to the LSI using the PLL PLL1, three kinds of operating state of the LSI internal circuit are provided to save power. The first state is an active state which performs normal operation. The second state is a sleep state wherein the LSI internal circuit is halted and the PLL functions. The third state is a standby state wherein both the LSI internal circuit and the PLL are halted. In the sleep state, as a clock signal is not supplied to the internal circuit, power consumption can be reduced, and in the standby state, the PLL also stops functioning so power consumption can be reduced further. When the internal circuit returns to the active state from the standby state, the PLL starts operation from the idle state, and a clock signal is supplied to the internal circuit after the clock settling time has elapsed. As mentioned above, a long time of 40 or more clock signal periods is needed for the PLL clock settling time. Hence, in order to speed up return from the active state, the sleep state is provided wherein the PLL PLL1 alone operates while the internal circuit is halted. The user of the LSI controls the operating state of the LSI as needed using the operating system (OS) or application software.

When the CMOS LSI circuit comprising the oscillator OSC supplies a clock signal to the LSI using the DLL DLL1, the operating state of the LSI internal circuit may be of two kinds. As the DLL has a clock settling time as short as 2–3 periods, it can rapidly start operating from the idle state and supply a clock signal to the internal circuit. Therefore, the DLL can be halted even in the aforesaid sleep state, and the DLL and LSI internal circuit can be halted both in the sleep state and the standby state. For this reason, power consumption can be reduced more than in the case where the PLL is used. Moreover, a stable clock signal can be distributed to the LSI at an early time when the LSI circuit starts up.

FIG. 26 is a drawing showing one embodiment of the PLL.

The PLL comprises a phase frequency detector PFD, charge pump CP, low-pass filter LPF, voltage control oscillator circuit VCO and frequency divider DIV00. The phase frequency detector PFD inputs clkin and the feedback signal clk261 using the input clock signal clkin as a reference signal, and generates a signal according to the frequency difference and phase difference of the two clock signals. The output of the phase frequency detector PFD is converted to a constant voltage output by the charge pump CP and the low-pass filter LPF. The voltage control oscillator circuit VCO outputs a clock signal of a frequency depending on the voltage value of the constant voltage output from the low pass filter as clkout. The clock signal output clkout is divided in frequency by the frequency divider DIV00, and again input into the phase frequency detector PFD as the feedback signal clk261. By repeating the above process, the PLL synchronizes the frequency and phase of the input clock signal clkin and feedback signal clk261. Therefore, when the frequency division of the frequency divider DIV00 is 1/N, the frequency of the output clock signal clkout will be N times the input clock signal clkin, and N times frequency multiplication can be performed. Although the PLL can multiply the frequency of the input clock signal to generate the output clock signal as described-above, 40 or more periods of clock signals are needed for the clock settling time until a clock signal with synchronized and stable frequency and phase can be supplied.

FIG. 27 is a drawing showing an embodiment of the DLL.

The DLL comprises a delay controlled line DCL, control signal register REG, timing control circuit MCC, forward delay array FDA and frequency divider DIV01. The input signal clkin of period Tin of the clock signal is delayed by a time Tdc1 via the delay controlled line DCL, and a clock signal dclk is output. The clock signal dclk is further delayed by a time Tdrv via a clock driver DRV to output the clock signal clkout. Therefore, the delay of the output clock signal clkout and input clock signal clkin is Tdc1+Tdrv. The output clock signal clkout is input to the forward delay array FDA. The forward delay array FDA has plural outputs, and outputs a clock signal whereby the output clock signal clkout is delayed a little at a time. The delay of the clock signal dclk and clock output signal clkout is equal to Tdrv. The timing control circuit MCC detects an output position of the forward delay array FDA at which the delay between the clock signal dclk and forward delay array is Tfda=Tin−Tdrv. The control signal register REG stores the detection position of the timing control circuit MCC, and selects the delay of the delay controlled line DCL. The delay which the delay controlled line DCL selects is Tdc1=Tfda. The delay between the output clock signal clkout and input clock signal clkin is actually Tdc1+Tdrv=Tfda+Tdrv=(Tin−Tdrv)+Tdrv=Tin, and a signal delayed by exactly one clock signal period is output. Thus, the DLL outputs a clock signal having a phase synchronized with the input clock signal. The DLL determines the delay position one period after the clock signal is input, and outputs a clock signal with synchronized phase delayed by one period. Therefore, phase synchronization is performed two periods after inserting the input signal, and a synchronized signal is output from the third period. In this case, the clock settling time of the DLL is as short as three periods. However, the DLL cannot output a signal with frequency multiplication as can be done with the PLL.

Figure 2:
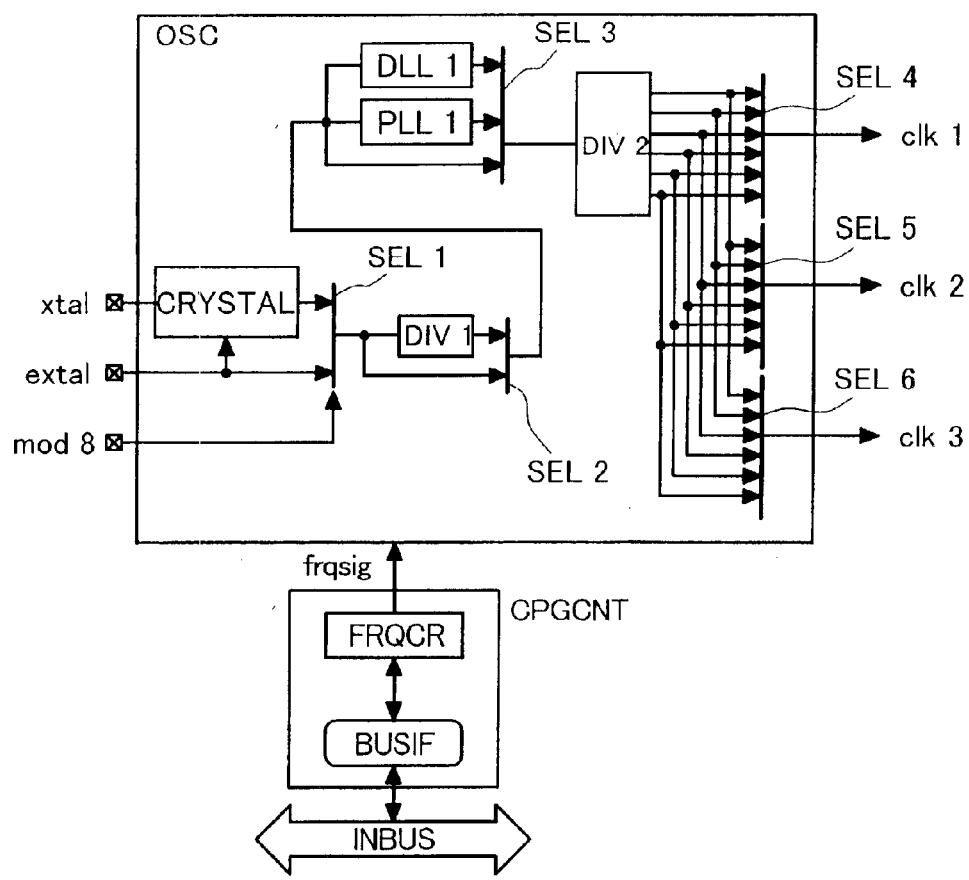
FIG. 2 is another block diagram of the semiconductor integrated circuit according to this invention.

FIG. 2 is a drawing showing another embodiment of this invention.

The oscillator OSC in the CMOS LSI circuit comprises the crystal oscillator circuit CRYSTAL, selector circuits SEL1, SEL2, SEL3, SEL4, SEL5, SEL6, frequency dividers DIV1, DIV2, phase-locked loop (PLL) PLL1 and delay-locked loop (DLL) DLL1. Likewise, a clock control circuit CPGCNT in the CMOS LSI circuit comprises a frequency control register FRQCR and bus interface BUSIF.

The oscillator OSC performs the same operations the oscillator OSC of FIG. 1. The clock control circuit CPGCNT receives a clock control command from an internal bus INBUS in the LSI circuit, a frequency control signal frqsig is output, the selection of the selector circuits SEL2, SEL3, SEL4, SEL5, SEL6 in the oscillator OSC is determined, and the selection of the PLL PLL1 or DLL DLL1 and the division ratio of the frequency divider are selected. In the clock control circuit CPGCNT, the bus interface BUSIF performs decoding of the clock control command from the internal bus INBUS, and the frequency control register FRQCR is rewritten. The frequency control signal frqsig outputs a signal according to the setting of the frequency control register FRQCR, and selects a selector circuit of the oscillator OSC. In this way, a command is sent to the internal bus INBUS in the CMOS LSI circuit using an operating system or application software, and the clock generating circuit PLL1 or DLL1 in the oscillator OSC can be selected, or the frequency of the clock signal distributed to the LSI can be determined.

Figure 3:
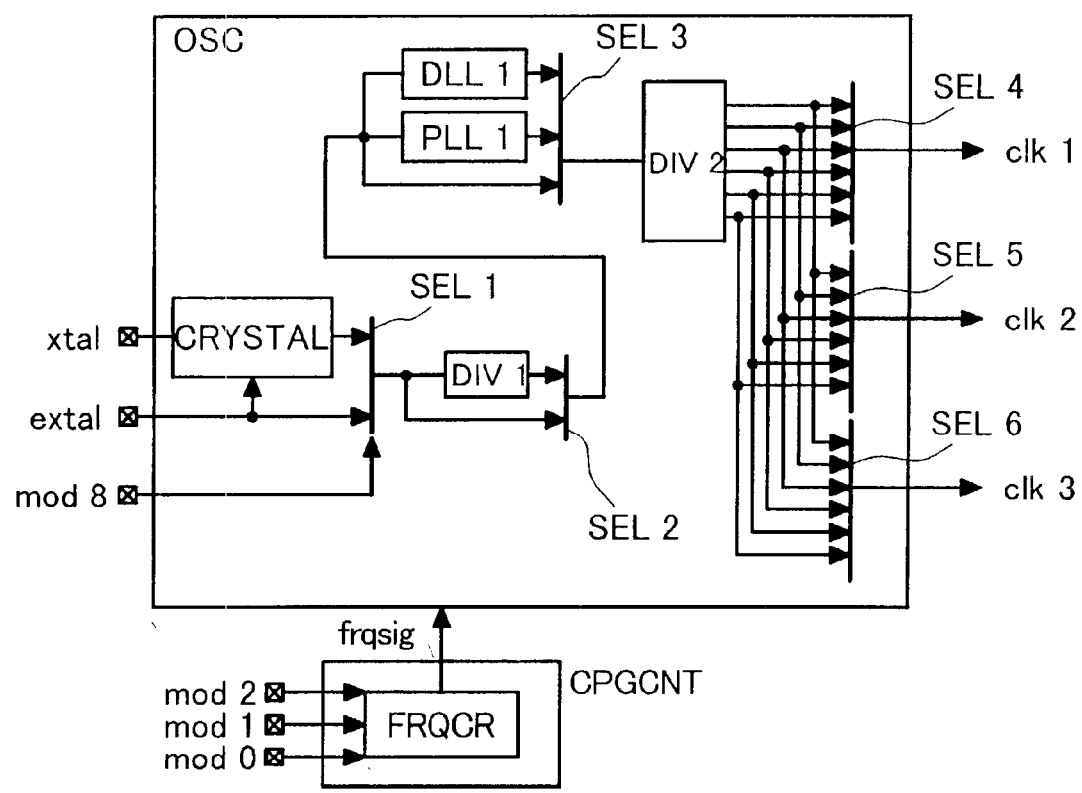
FIG. 3 is another block diagram of the semiconductor integrated circuit according to this invention.

FIG. 3 is a drawing showing another embodiment of this invention.

The oscillator OSC in the CMOS LSI circuit comprises the crystal oscillator circuit CRYSTAL, selector circuits SEL1, SEL2, SEL3, SEL4, SEL5, SEL6, frequency dividers DIV1, DIV2, phase-locked loop (PLL) PLL1 and delay-locked loop (DLL) DLL1. Likewise, the clock control circuit CPGCNT in the CMOS LSI circuit comprises a frequency control register FRQC.

The oscillator OSC performs the same operations as the oscillator OSC of FIG. 1. The clock control circuit CPGCNT has at least one of the mode terminals mod0, mod1 and mod2 which receive signals from outside the LSI circuit. The frequency control register FRQCR is determined by the input signal of-the mode terminal, generates the output frqsig according to the setting of the frequency control register FRQCR, and determines the output selection of the selector circuit of the oscillator OSC. In this construction, the clock generating circuit PLL1 or DLL1 in the oscillator OSC is selected and the frequency of the clock signal distributed to the LSI is determined by a control signal to the mode terminal from outside.

Figure 4:
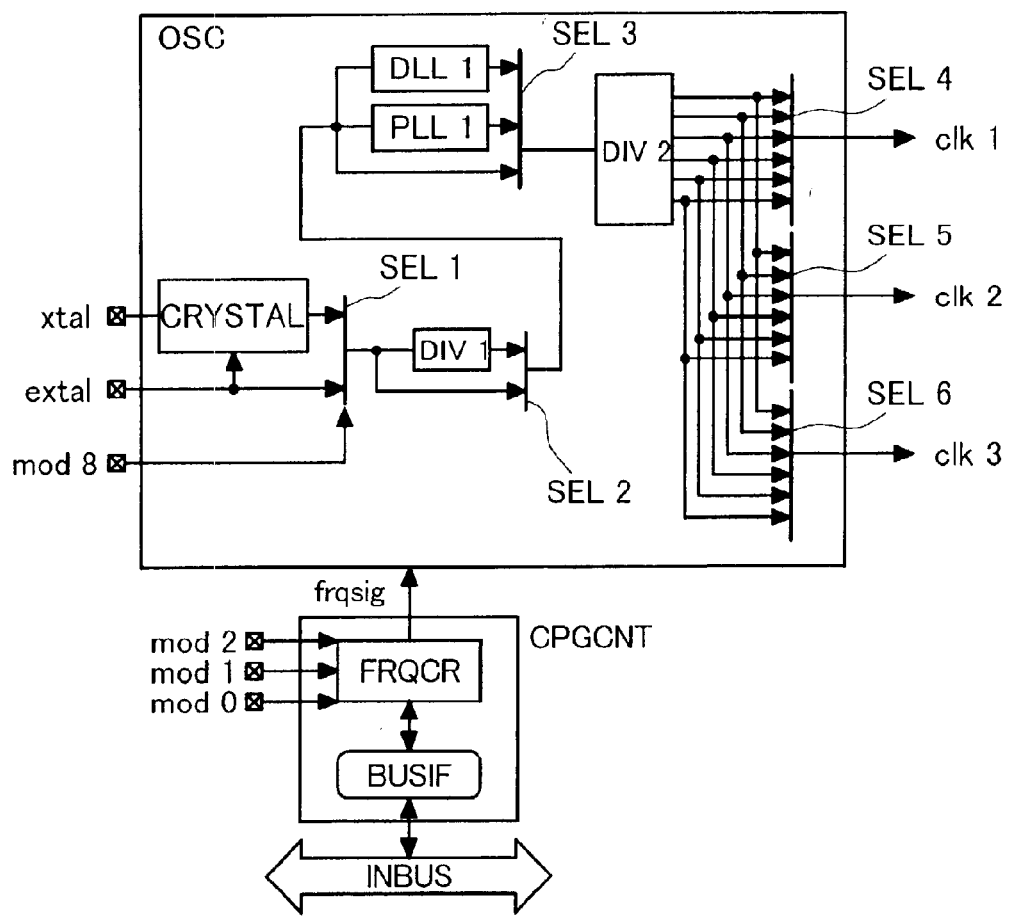
FIG. 4 is another block diagram of the semiconductor integrated circuit according to this invention.

FIG. 4 is a drawing showing another embodiment of this invention.

The oscillator OSC in the CMOS LSI circuit comprises the crystal oscillator circuit CRYSTAL, selector circuits SEL1, SEL2, SEL3, SEL4, SEL5, SEL6, dividers DIV1, DIV2, phase-locked loop (PLL) PLL1 and delay-locked loop (DLL) DLL1. Likewise, the clock control circuit CPGCNT in the CMOS LSI circuit comprises the frequency control register FRQCR and bus interface BUSIF.

The oscillator OSC performs the same operations as the oscillator OSC in FIG. 1. The clock control circuit CPGCNT receives a clock control command from the internal bus INBUS of the LSI circuit, control signals are input from the mode terminals mod0, mod1 and mod2, etc., the frequency control signal frqsig is output, the selection of the selector circuits SEL2, SEL3, SEL4, SEL5, SEL6 in the oscillator OSC is determined, and the PLL PLL1 or DLL DLL1 and the division ratio of the frequency divider are selected. In the clock control circuit CPGCNT, the bus interface BUSIF decodes the clock control command from the internal bus INBUS, and the frequency control register FRQCR is rewritten. Alternatively, a signal is input from the mode terminals mod0, mod1, mod2, etc., and the frequency control register FRQCR is rewritten. The frequency control signal frqsig outputs a signal according to the setting of the frequency control register FRQCR, and selects the selector circuit of the oscillator OSC. In this way, the clock generating circuit PLL1 or DLL1 in the oscillator OSC can be selected by sending a command to the internal bus INBUS in the CMOS LSI circuit using the control signal to the mode terminal from outside and the operating system or application software, and the frequency of the clock signal distributed to the LSI can be determined. The rewriting of the frequency register FRQCR by the control signal of the mode terminal may be performed only when the CMOS LSI circuit starts, and rewriting performed by the control command from the internal bus in other cases.

Figure 5:
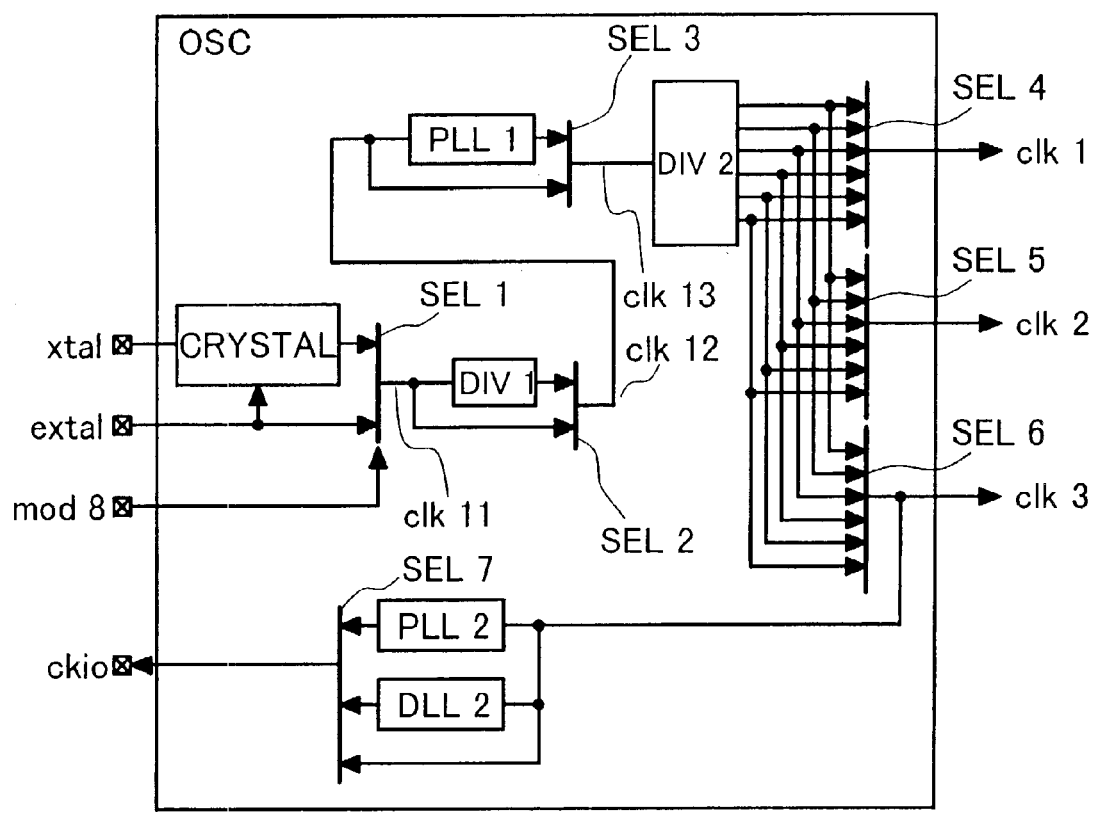
FIG. 5 is another block diagram of the semiconductor integrated circuit according to this invention.

FIG. 5 is a drawing showing another embodiment of this invention.

The oscillator OSC in the CMOS LSI circuit comprises the crystal oscillator circuit CRYSTAL, selector circuits SEL1, SEL2, SEL3, SEL4, SEL5, SEL6, SEL7, frequency dividers DIV1, DIV2, phase-locked loops (PLL) PLL1, PLL2, and a delay-locked loop (DLL) DLL2.

The terminals xta1, exta1 and mod8 are terminals in the oscillator OSC which receive signals from outside the LSI, and xta1 and exta1 are input into the crystal oscillator circuit CRYSTAL. The clock signal output of the crystal oscillator circuit CRYSTAL and the signal from the terminal exta1 are selected by the selector SEL1, and the clock signal clk11 is output. The selection of the selector SEL1 is performed by the terminal mod8, and the clock signal clk11 is divided by the frequency divider DIV1. The clock signal clk11 and the division output signal of the frequency divider DIV1 are selected by the selector SEL2, and the clock signal clk12 is output. The clock signal clk12 is supplied as a reference signal of the PLL PLL1, and it is used to generate synchronized clock signals. The selector SEL3 selects the clock signal clk12 or the clock signal output from the PLL PLL1. The clock signal selected here is divided by the frequency divider DIV2, and is distributed to the LSI as clock signals. The signal divided by the frequency divider DIV2 is obtained as clock signals of desired frequencies by the plural selector circuits SEL4, SEL5, SEL6, and plural clock signals of different frequencies, e.g., the clock signals clk1, clk2 and clk3, are thus supplied to the LSI. One of the clock signals supplied to the LSI, for example clk3, is supplied as a reference signal of the PLL PLL2 and DLL DLL2, and generates synchronized clock signals. The selector SEL7 selects one output from the clock signal clk3, the clock signal output by the PLL PLL2, and the clock signal output by the DLL DLL2. The clock signal selected here is output outside the LSI from the terminal ckio.

When a crystal resonator is used as a reference clock from outside the LSI, the output from the crystal resonator is applied to the terminal xta1 and terminal exta1, and regulation is performed by the crystal oscillator circuit CRYSTAL. Moreover, when a clock signal is supplied directly from outside, the signal is supplied from the terminal exta1. The selection of the signal due to the crystal resonator and the external clock signal is performed by the selector SEL1. The control of the selector SEL1 is performed by the mode terminal mod8. For example, when the terminal mod8 is High (1), the signal of the crystal resonator is acquired by the oscillator OSC as a reference signal, and when the terminal mod8 is Low (0), the external clock signal is acquired by the oscillator OSC as a reference signal. The two kinds of input signal can be freely changed over using the mode terminal mod8. The clock signal clk11 selected by the selector SEL1 is divided in clock frequency by the frequency divider DIV1. The selector SEL2 selects whether to transmit the clock signal clk11 directly or whether to divide it and then transmit it. The clock signal clk12 selected by the selector SEL2 is supplied to the PLL PLL1 as a reference signal. The selector circuit SEL3 selects the clock signal clk12 directly without passing through the clock generating circuit, or selects the clock signal output by the PLL PLL1 and outputs the clock signal clk13. When phase error does not pose a problem and the external clock signal is input to the LSI as it is, the selector SEL3 transmits the signal directly. When the external clock signal input is multiplied and supplied to the LSI, the output of the PLL PLL1 is selected. The clock signal clk13 is divided in frequency by the frequency divider DIV2, desired frequencies are selected by the selector circuits SEL4, SEL5, SEL, etc., and plural clock signals clk1, clk2, clk3 are thus supplied to the LSI. The combination of the frequency dividers DIV1, DIV2 and the selector circuits SEL2, SEL4, SEL5, SEL6, generates clock signals of plural frequencies which are distributed to the LSI. One of the clock signals distributed to the LSI, for example clk3, is supplied to the PLL PLL2 and DLL DLL2 as a reference signal. The selector SEL7 selects whether to transmit the clock signal clk3 directly without passing through the clock generating circuit, or, to select one clock signal from the clock signal output by the PLL PLL2 and the clock signal output by the DLL DLL2, and output the clock signal to the terminal ckio. When phase error does not pose a problem and the clock signal distributed to the LSI is supplied outside the LSI as it is, the selector SEL7 transmits the signal directly. When the clock signal distributed to the LSI and supplied outside the LSI is multiplied, the output of the PLL PLL2 is selected. When the clock signal distributed to the LSI is supplied outside the LSI without multiplying the clock signal, the output of the DLL DLL2 is selected. The clock signal output from the terminal ckio is supplied as a system clock in a system based on a microprocessor comprising this CMOS LSI.

When the CMOS LSI circuit comprising the oscillator OSC generates the clock signal using the PLL PLL1 or PLL2, three kinds of operating state of the LSI internal circuit are provided to save power consumption. The first state is an active state in which normal operation is performed. The second state is a sleep state in which the LS1 internal circuit is stopped, and the PLL is operated. The third state is a standby state in which both the LSI internal circuit and PLL are stopped. In the sleep state, as a clock signal is not supplied to the internal circuit, power consumption is reduced, and in the standby state, as the PLL also stops operating, power consumption is further reduced. When the internal circuit returns to the active state from the standby state, the PLL starts operating from the idle state, and after the clock settling time has elapsed, it supplies a clock signal to the internal circuit. As mentioned above, a long time of at least 40 clock signal periods is needed for the clock settling time of the PLL. Hence, to accelerate return from to the active state, the sleep state is provided wherein only the PLL PLL1 and PLL2 are operated, and the internal circuit is stopped. The user of the LSI controls the operating state of the LSI if needed using the operating system (OS) and application software.

When the CMOS LSI circuit comprising the oscillator OSC generates a clock signal using the DLL DLL2, two types of operating state of the LSI internal circuit are sufficient. As the clock settling time of the DLL is as short as two to three periods, operation can be started from the idle state and a clock signal supplied to the internal circuit rapidly. Therefore, the DLL can be stopped also in the above-mentioned sleep state, and the DLL and LSI internal circuit can be stopped in the sleep state or the standby state. For this reason, power consumption can be reduced compared to the case where the PLL is used. Also, a stable clock signal can be distributed at an early time to the LSI when the LSI circuit starts.

When the CMOS LSI circuit comprising the oscillator OSC generates the clock signal using a PLL and a DLL (for example, when the PLL1 and DLL2 are used), three kinds of operating state of the LSI internal circuit are required. During standby, the PLL and DLL stop with the internal circuit, and when there is a return to the active state, a clock settling time is required until the PLL assumes stable operation. In the sleep state, only the PLL is operated, and the DLL and internal circuit can be stopped. In this case, a return to the active state can be made at high speed.

Figure 6:
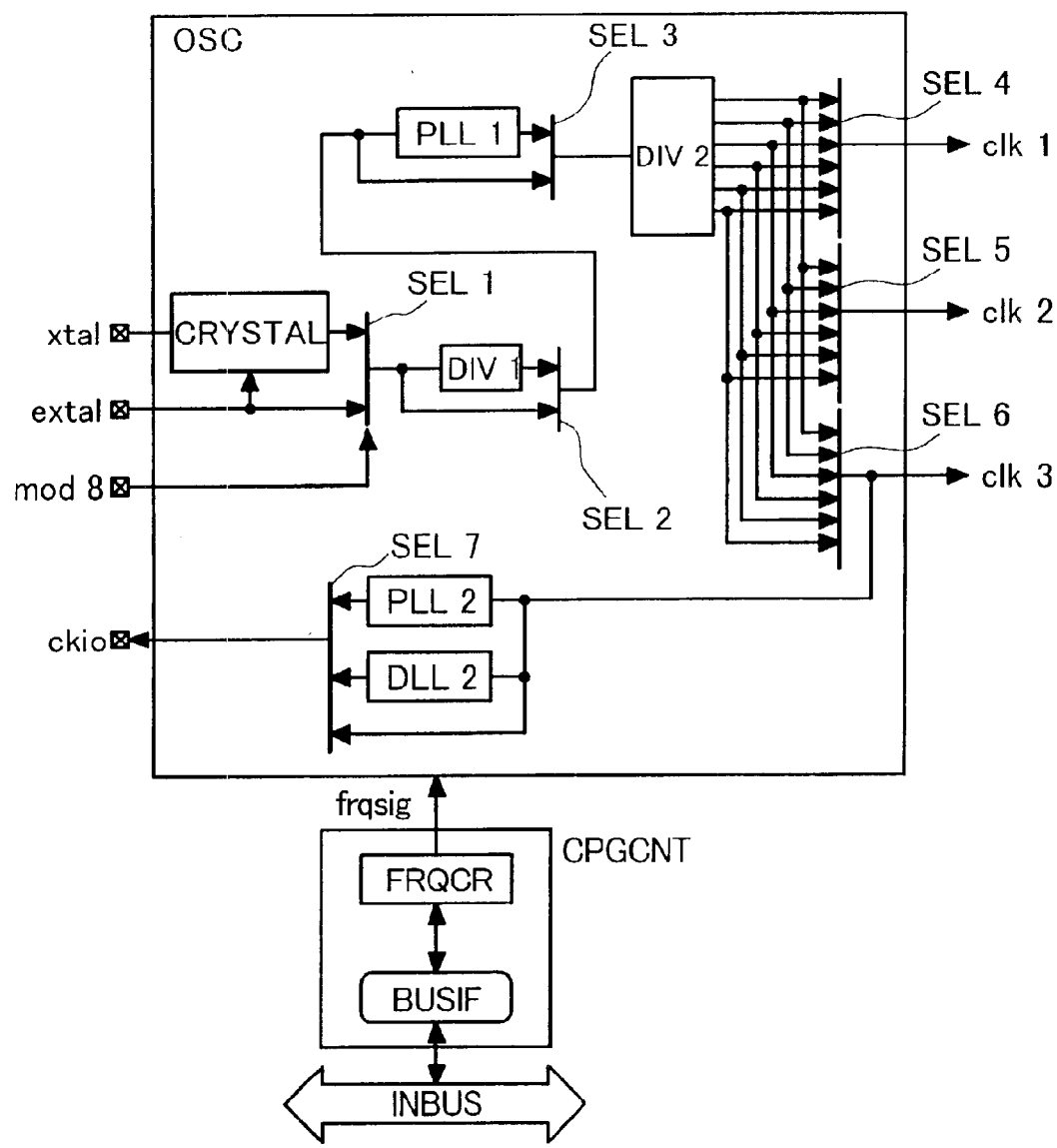
FIG. 6 is another block diagram of the semiconductor integrated circuit according to this invention.

FIG. 6 is a drawing showing another embodiment of this invention.

The oscillator OSC in the CMOS LSI circuit comprises the crystal oscillator circuit CRYSTAL, selector circuits SEL1, SEL2, SEL3, SEL4, SEL5, SEL6, SEL7, frequency dividers DIV1, DIV2, phase-locked loops (PLL) PLL1 and PLL2, and the delay-locked loop (DLL) DLL2. Likewise, the clock control circuit CPGCNT in the CMOS LSI circuit comprises the frequency control register FRQCR and bus interface BUSIF.

The oscillator OSC performs the same operations as the oscillator OSC of FIG. 5. The clock control circuit CPGCNT receives a clock control command from the internal bus INBUS in the LSI circuit, the frequency control signal frqsig is output, the selection of the selector circuits SEL2, SEL3, SEL4, SEL5, SEL6, SEL7 in the oscillator OSC is determined, the PLL PLL1, PLL2 or the DLL DLL2 are selected, and the division ratio of the frequency divider is selected. In the clock control circuit CPGCNT, the bus interface BUSIF performs decoding of the clock control command from the internal bus INBUS, and the frequency control register FRQCR is rewritten. The frequency control signal frqsig outputs a signal according to the setting of the frequency control register FRQCR, and selects the selector circuit of the oscillator OSC. In this way, a command is sent to the internal bus INBUS in the CMOS LSI circuit using the operating system or application software, the clock generating circuits PLL1, PLL2 or DLL2 in the oscillator OSC can be selected, or the frequency of the clock signal distributed to the LSI can be determined.

Figure 7:
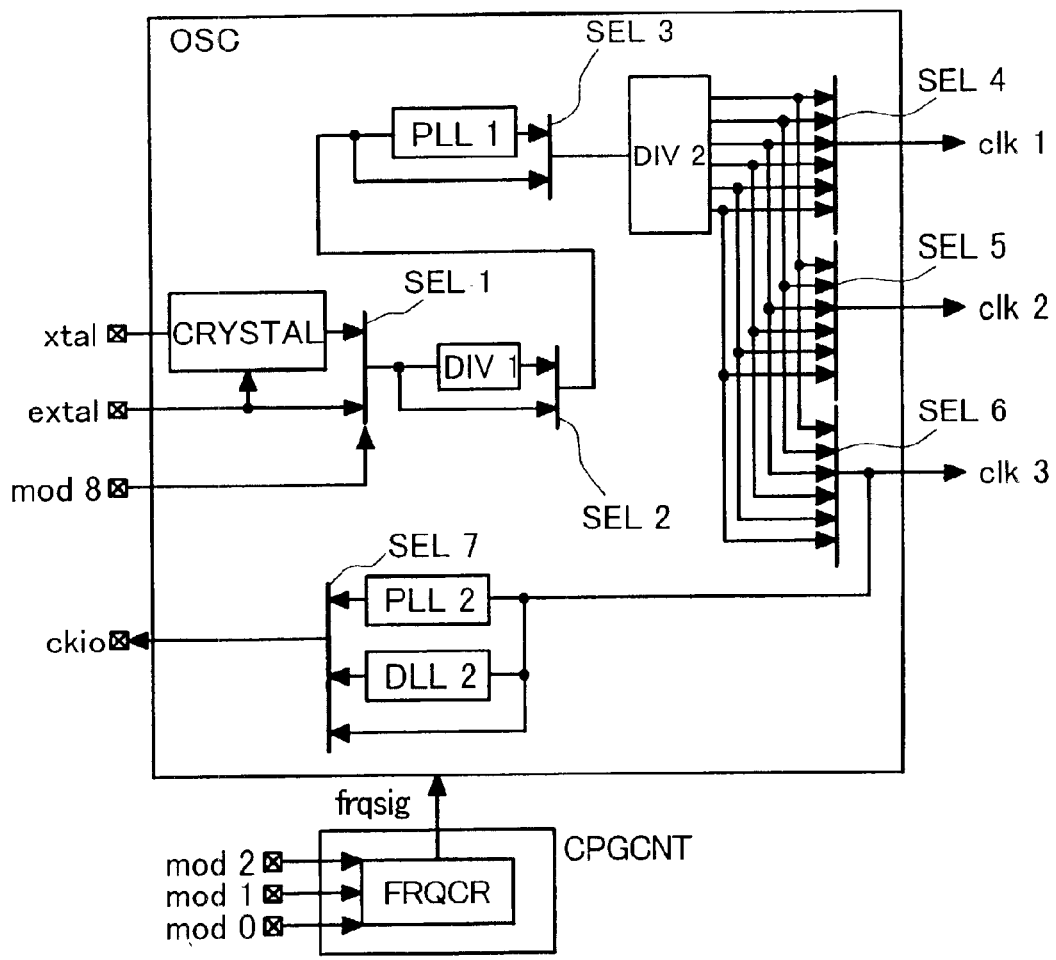
FIG. 7 is another block diagram of the semiconductor integrated circuit according to this invention.

FIG. 7 is a drawing showing another embodiment of this invention.

The oscillator OSC in the CMOS LSI circuit comprises the crystal oscillator circuit CRYSTAL, selector circuits SEL1, SEL2, SEL3, SEL4, SEL5, SEL6, SEL7, frequency dividers DIV1, DIV2, phase-locked loop (PLL) PLL1, PLL2 and delay-locked loop (DLL) DLL2. Likewise, the clock control circuit CPGCNT in the CMOS LSI circuit comprises the frequency control register FRQCR.

The oscillator OSC performs the same operations as those of the oscillator OSC of FIG. 5. The clock control circuit CPGCNT has at least one mode terminal mod0, mod1 or mod2 which receive signals from outside the LSI circuit. The frequency control register FRQCR is determined by the input signal of the mode terminal, generates the output frqsig according to the setting of the frequency control register FRQCR, and determines the output selection of the selector circuit of the oscillator OSC. In this construction, the clock generating circuits PLL1, PLL2 and DLL2 in the oscillator OSC can be selected and the frequency of the clock signal distributed to the LSI can be determined by the control signal supplied to the mode terminal from outside.

Figure 8:
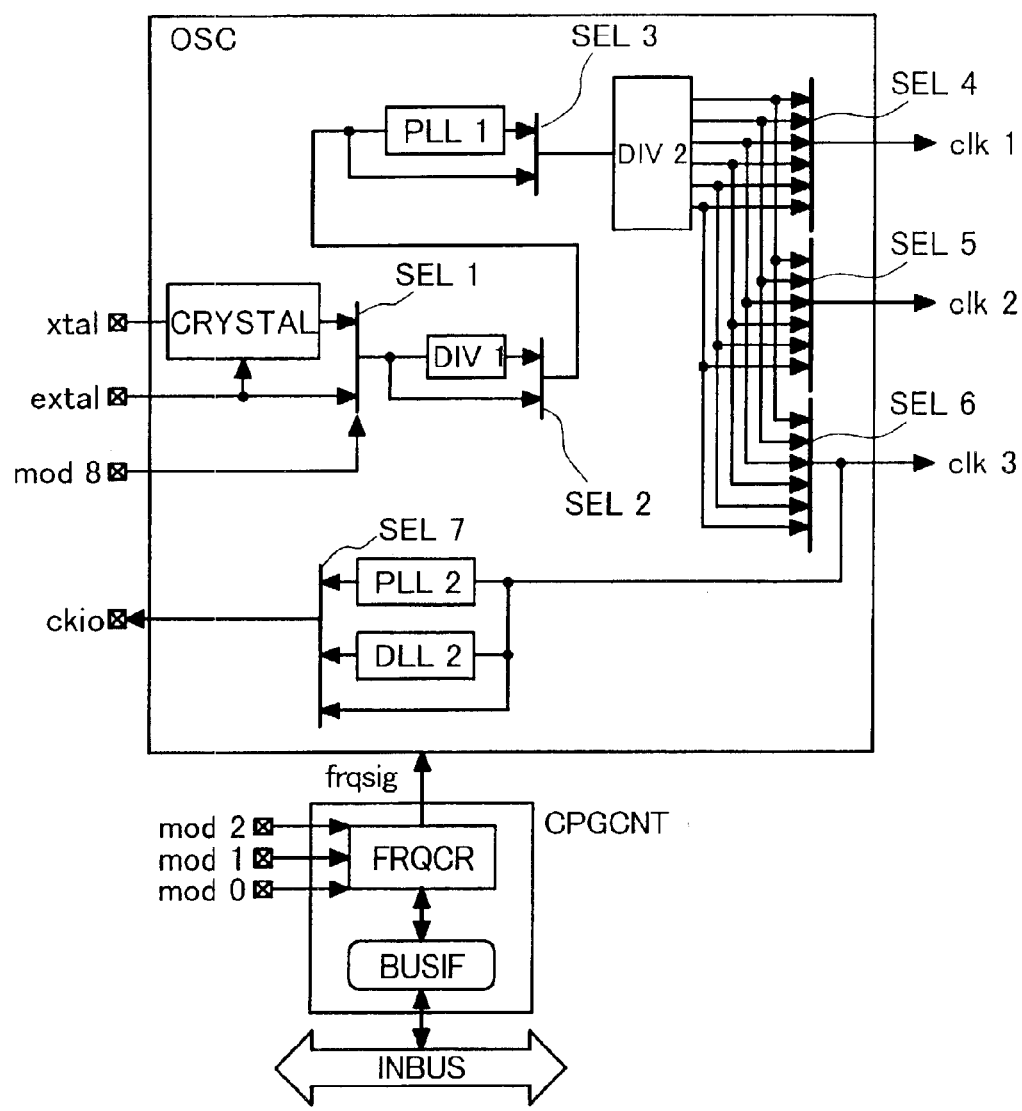
FIG. 8 is another block diagram of the semiconductor integrated circuit according to this invention.

FIG. 8 is a drawing showing another embodiment of this invention.

The oscillator OSC in the CMOS LSI circuit comprises the crystal oscillator circuit CRYSTAL, selector circuits SEL1, SEL2, SEL3, SEL4, SEL5, SEL6, SEL7, frequency dividers DIV1, DIV2, phase-locked loops (PLL) PLL1 and PLL2, and delay-locked loop (DLL) DLL2. Likewise, the clock control circuit CPGCNT in the CMOS LSI circuit comprises the frequency control register FRQCR and bus interface BUSIF.

The oscillator OSC performs the same operations as the oscillator OSC of FIG. 5. The clock control circuit CPGCNT receives a clock control command from the internal bus INBUS of the LSI circuit, a control signal is input from the mode terminals mod0, mod1, mod2, etc., the frequency control signal frqsig is output, the selection of the selector circuits SEL2, SEL3, SEL4, SEL5, SEL6, SEL7 in the oscillator OSC is determined, and the PLL PLL1, PLL2 or the DLL DLL2 and the division ratio of the frequency divider are selected. In the clock control circuit CPGCNT, the bus interface BUSIF decodes the clock control command from the internal bus INBUS, and the frequency control register FRQCR is rewritten. Alternatively, the control signal is input from the mode terminals mod0, mod1, mod2, and the frequency control register FRQCR is rewritten. The frequency control signal frqsig outputs a signal according to the setting of the frequency control register FRQCR, and selects a selector circuit of the oscillator OSC. In this way, the clock generating circuits PLL1, PLL2 or DLL2 in the oscillator OSC can be selected by sending a command to the internal bus INBUS in the CMOS LSI circuit using the control signal supplied to the mode terminal from outside, the operating system and application software, and the frequency of the clock signal distributed to the LSI can be determined. The rewriting of the frequency register FRQCR by the control signal of the mode terminal may be performed only when the CMOS LSI circuit starts, and rewriting performed by the control command from the internal bus in other cases.

Figure 9:
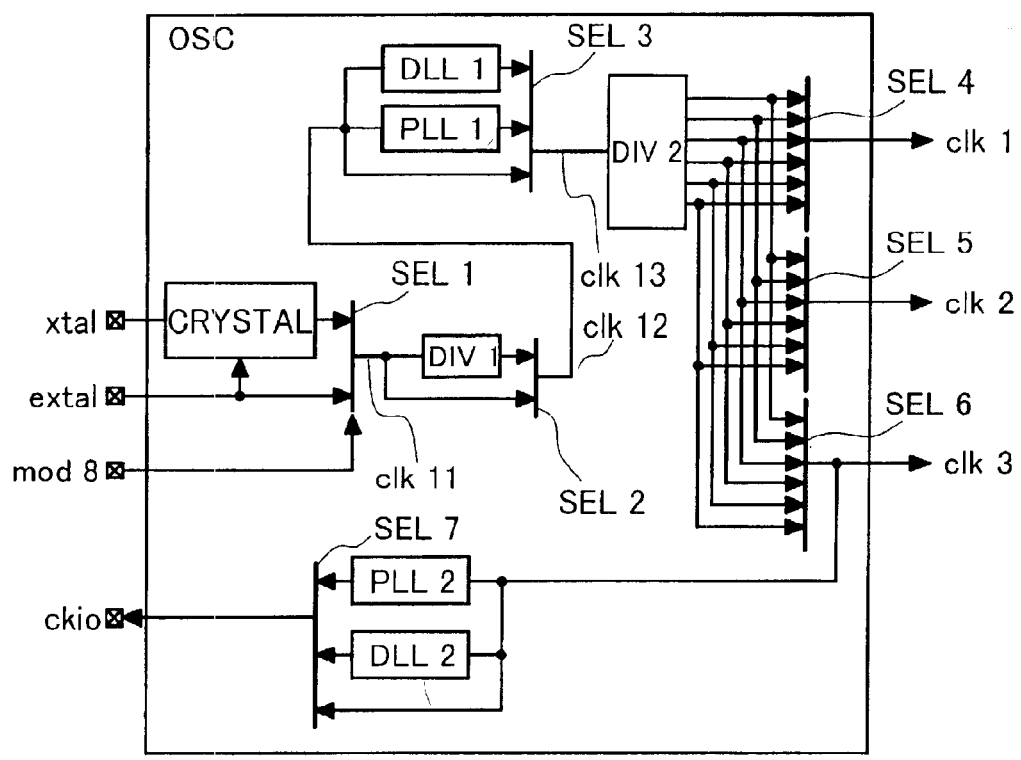
FIG. 9 is another block diagram of the semiconductor integrated circuit according to this invention.

FIG. 9 is a drawing showing another embodiment of this invention.

The oscillator OSC in the CMOS LSI circuit comprises a crystal oscillator CRYSTAL, selectors SEL1, SEL2, SEL3, SEL4, SEL5, SEL6, frequency dividers DIV1, DIV2, phase-locked loops (PLL) PLL1, PLL2, and delay-locked loops (DLL) DLL1, DLL2.

xta1, exta1 and mod8 are terminals in the oscillator OSC which receive signals from outside the LSI, and xta1 and exta1 are input to the crystal oscillator CRYSTAL. Signals from the clock signal output of the crystal oscillator CRYSTAL and the terminal exta1 are selected by the selector SEL1, and the clock signal clk11 is output. The selection of the selector SELL is performed by the terminal mod8. The clock signal clk11 is divided by the frequency divider DIV1. The clock signal clk11 and the division output signal of the frequency divider DIV1 are selected by the selector SEL2, and the clock signal clk12 is output. The clock signal clk12 is supplied as a reference signal to the PLL PLL1 and DLL DLL1, and synchronized clock signals are respectively generated. The selector SEL3 selects one of the clock signal clk12, clock signal output by the PLL PLL1, and the clock signal output by the DLL DLL1. The clock signal selected here is divided by the frequency divider DIV2, and is distributed to the LSI as clock signals. The signal divided by the frequency divider DIV2 is obtained as clock signals of desired frequencies by the plural selector circuits SEL4, SEL5, SEL6, and plural clock signals of different frequencies, i.e., the clock signals clk1, clk2, clk3, are thus supplied to the LSI. One of the clock signals supplied to the LSI, for example clk3, is supplied to the PLL PLL2 and DLL DLL2 as a reference signal, and synchronized clock signals are respectively generated. One of the clock signal clk3, clock signal output by the PLL PLL2 and clock signal output by the DLL DLL2 is selected by the selector circuit SEL7. The clock signal selected here is output from the terminal ckio to outside the LSI.

When a crystal resonator is used as a reference clock from outside the LSI, the output signal from the crystal resonator is applied to the terminals xta1, exta1, and waveform regulation is performed by the crystal oscillator CRYSTAL. When a clock signal is directly supplied from outside, a signal is supplied from the terminal exta1. The selection of the signal from the crystal resonator and the external clock signal is performed by the selector SEL1. Control of the selector SEL1 is performed by the mode terminal mod8. For example, when the terminal mod8 is High (1), the signal of the crystal resonator is acquired by the oscillator OSC as a reference signal, and when the terminal mod8 is Low (0), an external clock signal is acquired by the oscillator OSC as a reference signal. The two kinds of input signal can be freely changed over using the mode terminal mod8. The clock signal clk11 selected by the selector SEL1 is divided in clock frequency by the frequency divider DIV1. The selector SEL2 selects whether to directly transmit the clock signal clk11 or to divide it and transmit it. The clock signal clk12 selected by the selector SEL2 is supplied to the PLL PLL1 and DLL DLL1 as a reference signal. The PLL can output a clock signal obtained by multiplying the frequency of the reference clock, but at least 40 periods of the input clock signal are required for the clock settling time until the clock frequency and phase stabilize at the desired values. The DLL can output a clock signal of the same frequency as the reference clock with synchronized phase, but it cannot multiply the frequency. Also, the DLL requires only about 2–3 periods of the input clock signal for the clock settling time. The selector SEL3 transmits the clock signal clk12 directly without passing through the clock generating circuit, or, selects the clock signal output by the PLL PLL1 or the clock signal output by the DLL DLL1 and outputs the clock signal clk13. When phase error does not pose a problem and the external clock signal is input to the LSI as it is, the selector SEL3 transmits the signal directly. When the external clock signal input is multiplied and supplied to the LSI, the output signal from the PLL PLL1 is selected. When multiplication is not performed on the external clock signal and only the division signal is supplied to the LSI, the output of the DLL DLL1 is selected. The clock signal clk13 is further divided in frequency by the frequency divider DIV2, desired frequencies are selected by the selector circuits SEL4, SEL5, SEL6, and the plural clock signals clk1, clk2, clk3 are thus supplied to the LSI. By suitably combining the frequency dividers DIV1, DIV2 and the selectors SEL2, SEL4, SEL5, SEL6, clock signals having various frequencies can be generated and distributed to the LSI. One of the clock signals distributed to the LSI, for example clk3, is supplied to the PLL PLL2 and DLL DLL2 as a reference signal. The selector SEL7 selects whether to transmit the clock signal clk3 directly without passing through the clock generating circuit, or, to select one clock signal from the clock signal output by the PLL PLL2 and the clock signal output by the DLL DLL2, and outputs the clock signal to the terminal ckio. When phase error does not pose a problem and the clock signal distributed to the LSI is supplied outside the LSI as it is, the selector SEL7 transmits the signal directly. When the clock signal distributed to the LSI and supplied outside the LSI is multiplied, the output of the PLL PLL2 is selected. When the clock signal distributed to the LSI is supplied outside the LSI without multiplication, the output of the DLL DLL2 is selected. The clock signal output from the terminal ckio is supplied as a system clock in a system based on a microprocessor comprising this CMOS LSI.

When a CMOS LSI circuit comprising the oscillator OSC supplies a clock signal to the LSI using the PLL PLL1 or PLL2, three kinds of operating state of the LSI internal circuit are provided to save power. The first state is an active state which performs normal operation. The second state is a sleep state wherein the LSI internal circuit is halted and the PLL functions. The third state is a standby state wherein both the LSI internal circuit and the PLL are halted. In the sleep state, as a clock signal is not supplied to the internal circuit, power consumption can be reduced, and in the standby state, the PLL also stops functioning so power consumption can be reduced further. When the internal circuit returns to the active state from the standby state, the PLL starts operation from the idle state, and a clock signal is supplied to the internal circuit after the clock settling time has elapsed. As mentioned above, a long time of 40 or more clock signal periods is needed for the PLL clock settling time. Hence, in order to speed up return from the active state, the sleep state is provided wherein the PLL PLL1 alone operates while the internal circuit is halted. The user of the LSI controls the operating state of the LSI as needed using the operating system (OS) or application software.

When the CMOS LSI circuit comprising the oscillator OSC generates a clock signal using the DLL DLL1 or DLL2, the operating state of the LSI internal circuit may be of two kinds. As the DLL has a clock settling time as short as 2–3 periods, it can rapidly start operating from the idle state and supply a clock signal to the internal circuit. Therefore, the DLL can be halted even in the aforesaid sleep state, and the DLL and LSI internal circuit can be halted both in the sleep state and the standby state. For this reason, power consumption can be reduced more than in the case where the PLL is used. Moreover, a stable clock signal can be distributed to the LSI at an early time when the LSI circuit starts up.

When the CMOS LSI circuit comprising the oscillator OSC generates a clock signal using the PLL and DLL, for example when the PLL1 and DLL2 or PLL2 and DLL1 are used, three operating states of the LSI internal circuit are required. During standby, the PLL and DLL both stop together with the internal circuit, and when there is a return to the active state, a clock settling time is required until the PLL operates stably. In the sleep state, only the PLL is operated, and the PLL and internal circuit can be halted. In this case, there is a rapid return to the active state.

Figure 10:
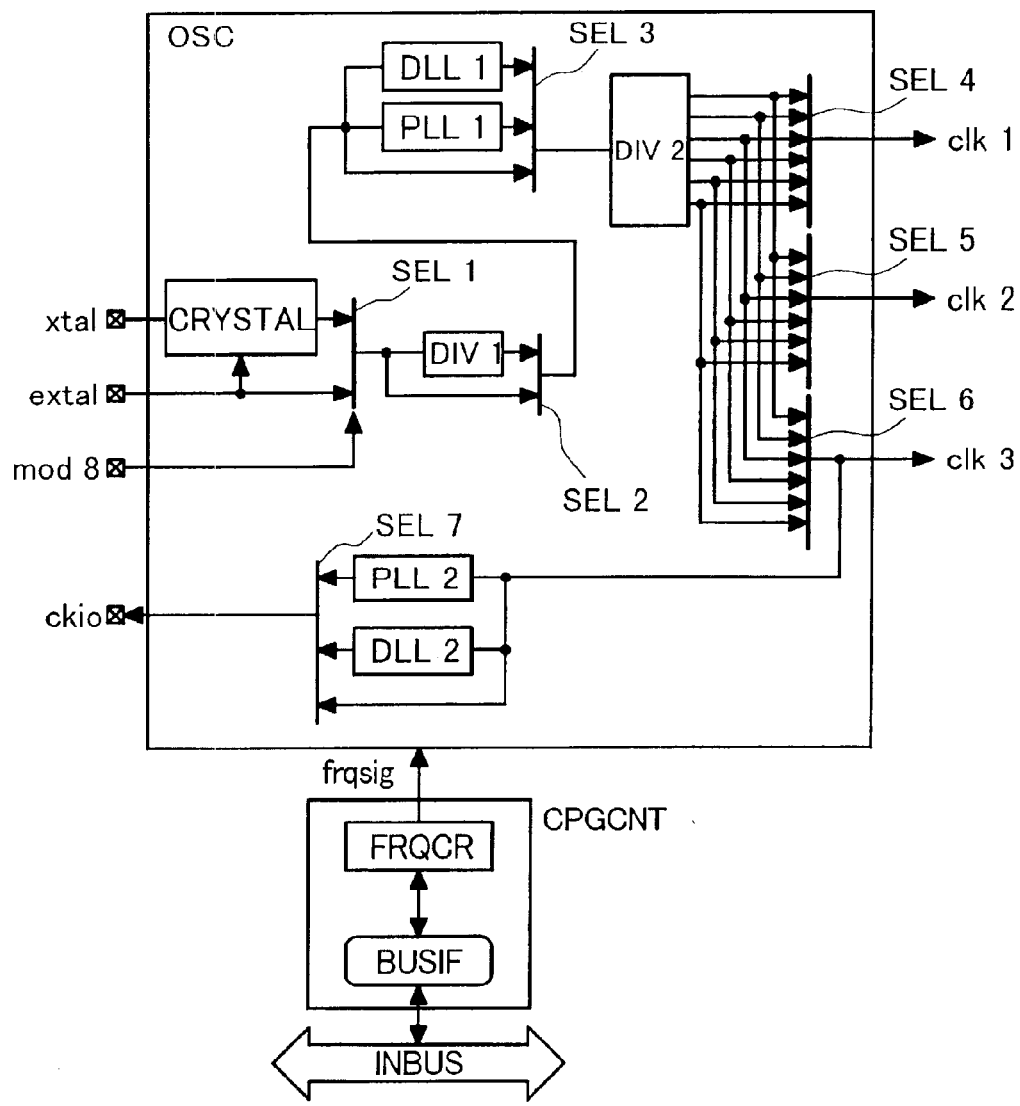
FIG. 10 is another block diagram of the semiconductor integrated circuit according to this invention.

FIG. 10 shows another embodiment of this invention.

The oscillator OSC in the CMOS LSI circuit comprises the crystal oscillator circuit CRYSTAL, selector circuits SEL1, SEL2, SEL3, SEL4, SEL5, SEL6, SEL7, frequency dividers DIV1, DIV2, phase-locked loops (PLL) PLL1, PLL2 and delay-locked loops (DLL) DLL1, DLL2. Likewise, the clock control-circuit CPGCNT in the CMOS LSI circuit comprises the frequency control register FRQCR and bus interface BUSIF.

The oscillator OSC performs the same operations as the oscillator OSC of FIG. 9. The clock control circuit CPGCNT receives a clock control command from the internal bus INBUS of the LSI circuit, the frequency control signal frqsig is output, the selection of the selector circuits SEL2, SEL3, SEL4, SEL5, SEL6, SEL7 in the oscillator OSC is determined, and the PLL PLL1, PLL2 or DLL DLL1, DLL2 and the division ratio of the frequency divider are selected. In the clock control circuit CPGCNT, the bus interface BUSIF decodes the clock control command from the internal bus INBUS, and the frequency control register FRQCR is rewritten. The frequency control signal frqsig outputs a signal according to the setting of the frequency control register FRQCR, and selects the selector circuit of the oscillator OSC. In this way, a command is sent to the internal bus INBUS in the CMOS LSI circuit using the operating system or application software, the clock generating circuit PLL1, PLL2 or DLL1, DLL2 in the oscillator OSC can be selected, and the frequency of the clock signal distributed to the LSI can be determined.

Figure 11:
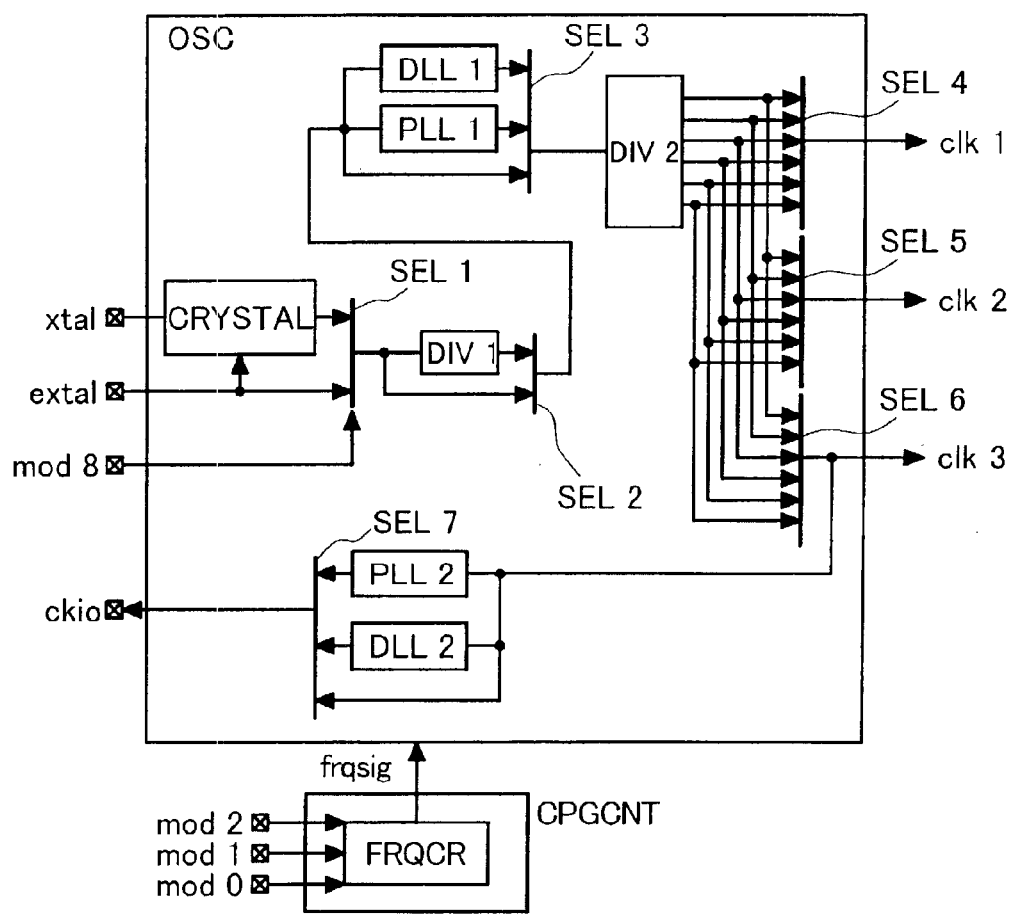
FIG. 11 is another block diagram of the semiconductor integrated circuit according to this invention.

FIG. 11 shows another embodiment of this invention.

The oscillator OSC in the CMOS LSI circuit comprises the crystal oscillator circuit CRYSTAL, selector circuits SEL1, SEL2, SEL3, SEL4, SEL5, SEL6, SEL7, frequency dividers DIV1, DIV2, phase-locked loops (PLL) PLL1, PLL2 and delay-locked loops (DLL) DLL1, DLL2. Likewise, the clock control circuit CPGCNT in the CMOS LSI circuit comprises a frequency control register FRQCR.

The oscillator OSC performs the same operations as the oscillator OSC of FIG. 1. The clock control circuit CPGCNT has at least one of the mode terminals mod0, mod1 and mod2 which receive signals from outside the LSI circuit. The frequency control register FRQCR is determined by the input signal of the mode terminal, generates the output frqsig according to the setting of the frequency control register FRQCR, and determines the output selection of the selector circuit of the oscillator OSC. In this construction, the clock generating circuit PLL1, PLL2 or DLL1, DLL2 in the oscillator OSC is selected and the frequency of the clock signal distributed to the LSI is determined by a control signal to the mode terminal from outside.

Figure 12:
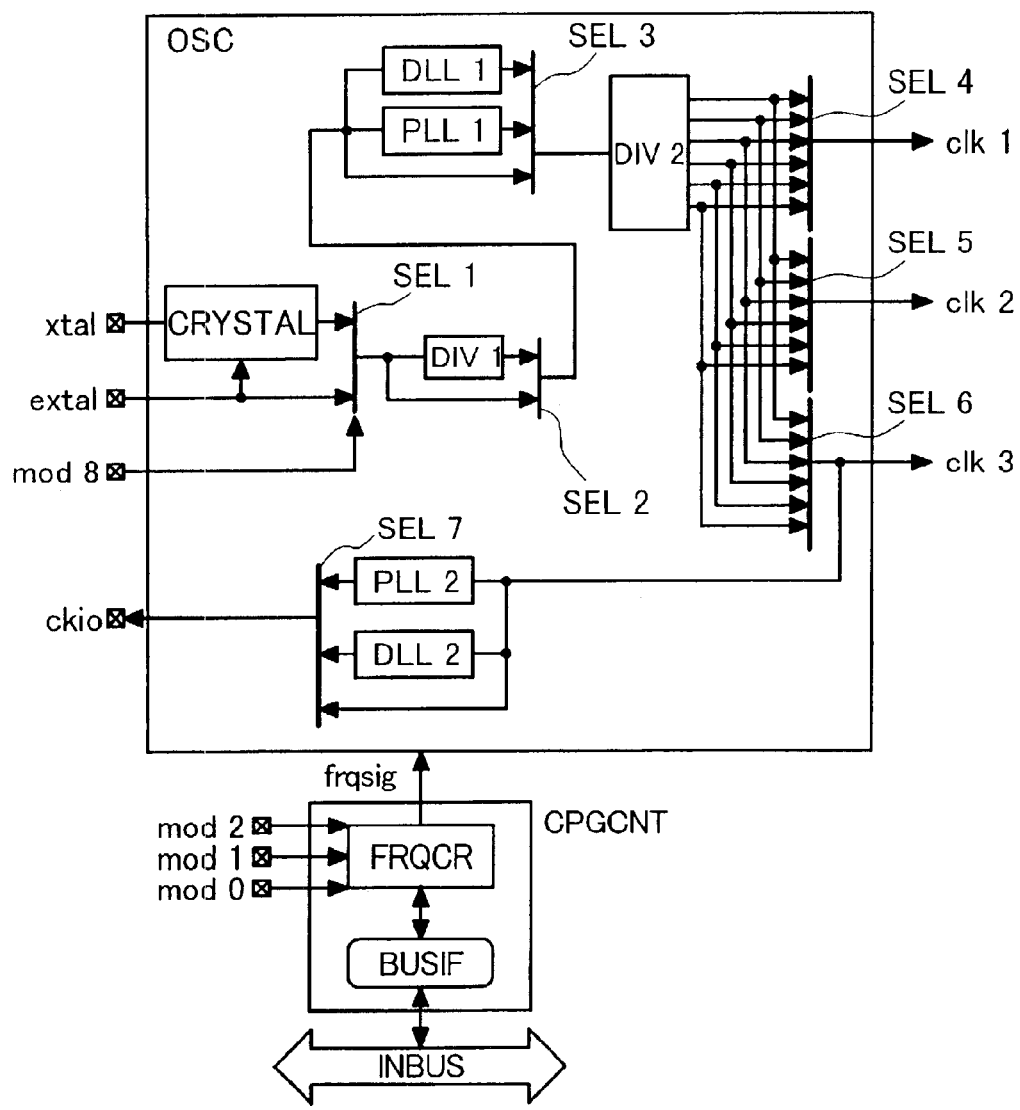
FIG. 12 is another block diagram of the semiconductor integrated circuit according to this invention.

FIG. 12 is a drawing showing another embodiment of this invention.

The oscillator OSC in the CMOS LSI circuit comprises the crystal oscillator circuit CRYSTAL, selector circuits SEL1, SEL2, SEL3, SEL4, SEL5, SEL6, SEL7, dividers DIV1, DIV2, phase-locked loops (PLL) PLL1, PLL2 and delay-locked loops (DLL) DLL1, DLL2. Likewise, the clock control circuit CPGCNT in the CMOS LSI circuit comprises the frequency control register FRQCR and bus interface BUSIF.

The oscillator OSC performs the same operations as the oscillator OSC in FIG. 9. The clock control circuit CPGCNT receives a clock control command from the internal bus INBUS of the LSI circuit; control signals are input from the mode terminals mod0, mod1, mod2, etc., the frequency control signal frqsig is output, the selection of the selector circuits SEL2, SEL3, SEL4, SEL5, SEL6, SEL7 in the oscillator OSC is determined, and the PLL PLL1, PLL2, or DLL DLL1, DLL2 and the division ratio of the frequency divider are selected. In the clock control circuit CPGCNT, the bus interface BUSIF decodes the clock control command from the internal bus INBUS, and the frequency control register FRQCR is rewritten. Alternatively, a control signal is input from the mode terminals mod0, mod1, mod2, etc., and the frequency control register FRQCR is rewritten. The frequency control signal frqsig outputs a signal according to the setting of the frequency control register FRQCR, and selects the selector circuit of the oscillator OSC. In this way, the clock generating circuits PLL1, PLL2 or DLL1, DLL2 in the oscillator OSC can be selected by sending a command to the internal bus INBUS in the CMOS LSI circuit using the control signal to the mode terminal from outside and the operating system or application software, and the frequency of the clock signal distributed to the LSI can be determined. The rewriting of the frequency register FRQCR by the control signal of the mode terminal may be performed only when the CMOS LSI circuit starts, and rewriting performed by the control command from the internal bus in other cases.

Figure 13:
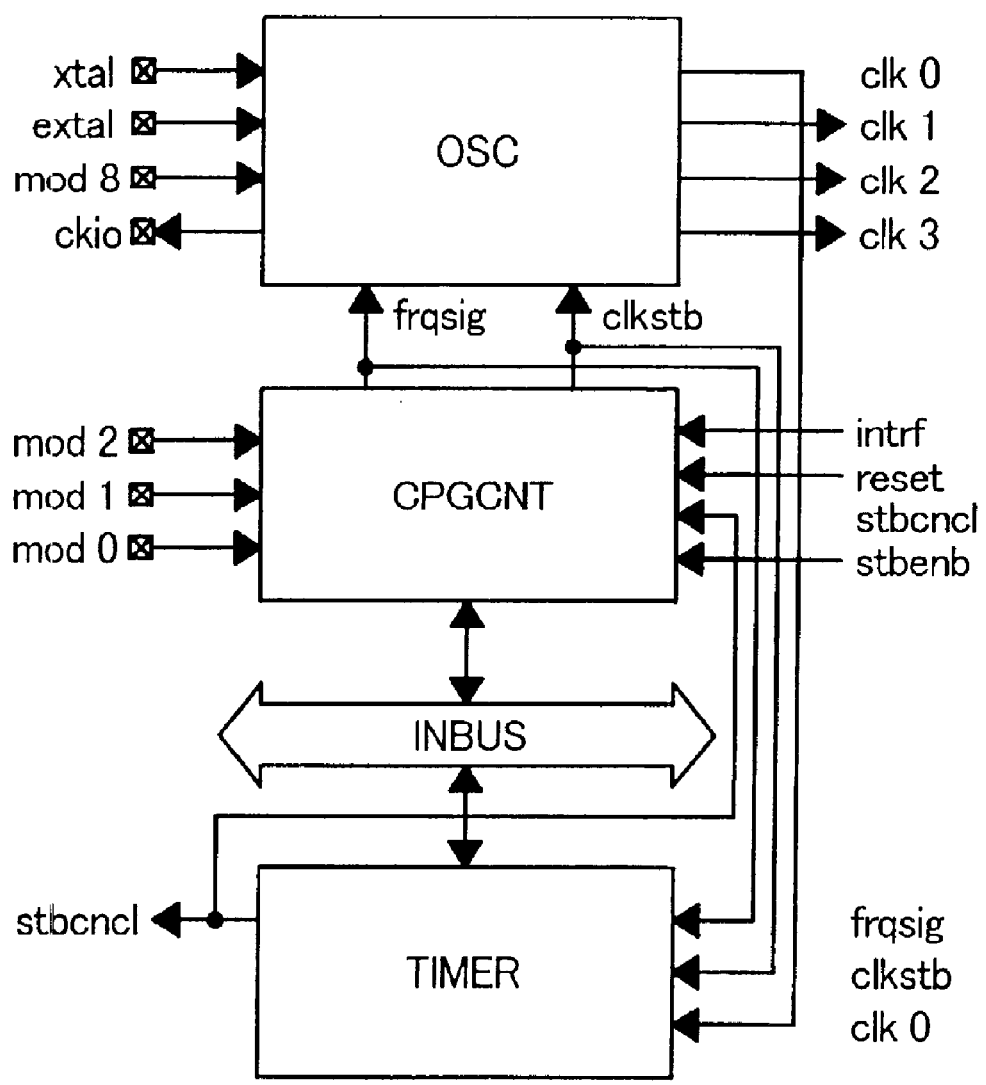
FIG. 13 is another block diagram of the semiconductor integrated circuit according to this invention.

FIG. 13 is a diagram showing another embodiment of this invention.

The oscillator OSC in the CMOS LSI circuit comprises the clock control circuit CPGCNT and timer circuit TIMER. The oscillator circuit inputs signals from outside via the terminal xtal, terminal extal and terminal mod8, inputs the frequency control signal frqsig and a clock standby signal clkstb from the clock control circuit CPGCNT, outputs a system clock signal to outside the LSI via the terminal ckio, and outputs at least one of the clock signals clk1, clk2, clk3 to the LSI circuit. The clock control circuit CPGCNT, comprising at least one of the mode terminals mod0, mod1, mod2, inputs a mode control signal from outside, inputs an interrupt signal INTRF, reset signal reset and standby enable signal stbenb from the LSI, receives a control command from the internal bus INBUS, inputs a standby cancel signal stbcncl from the timer circuit, and outputs the frequency control signal frqsig and clock standby signal clkstb to the oscillator OSC and timer circuit TIMER. The timer circuit receives the control command from the internal bus INBUS, inputs the clock signal clk0 from the oscillator OSC, inputs the frequency control signal frqsig and clock standby signal clkstb from the clock control circuit CPGCNT, and outputs the standby cancel signal stbcncl to the LSI circuit and clock control circuit CPGCNT.

The oscillator OSC inputs a crystal resonator clock signal from the terminal xtal and terminal extal as a reference clock signal. Alternatively, an external clock signal is input from the terminal extal as the reference clock signal. The change-over of input is performed by the terminal mod8. Based on this reference clock signal, at least one desired clock signal according to the frequency control signal frqsig is input to the LSI as clk1, clk2, clk3. The clock signal is also supplied outside the LSI as a system clock signal via the terminal ckio. Control is also performed to stop the clock generating circuit of the oscillator OSC and output or stop clk1, clk2, clk3 according to the clock standby signal clkstb. Due to the control signal input from outside the LSI via at least one of the mode terminals mod0, mod1, mod2, and the control command from the internal bus INBUS of the LSI, the clock control circuit CPGCNT outputs the frequency control signal frqsig which controls the clock signal output by the oscillator OSC. It also inputs the interrupt signal intrf, reset signal reset, standby enable signal stbenb or standby cancel signal stbcncl generated by the timer circuit TIMER, activates or stop the clock generating circuit of the oscillator OSC, and outputs the clock standby signal clkstb to output or stop the clock signal. The timer circuit TIMER inputs the frequency control signal frqsig and clock standby signal clkstb of the clock control circuit CPGCNT and if the clock control state or standby and operating state changes, it negates the standby cancel signal. In this case, part of the circuit in the oscillator OSC stops. The standby cancel signal counts time using the clock signal clk0 generated by the oscillator OSC as a clock, and when a predetermined time has elapsed, it is asserted and the oscillator OSC is released from the standby state.

The operating system or application software controls the timer circuit TIMER by supplying a command via the internal bus INBUS, and when the LSI internal circuit is in the active, sleep or standby state, control is performed to activate or stop the clock circuit and stop the output of the clock signal according to the state, which reduces power consumption of the LSI.

Figure 14:
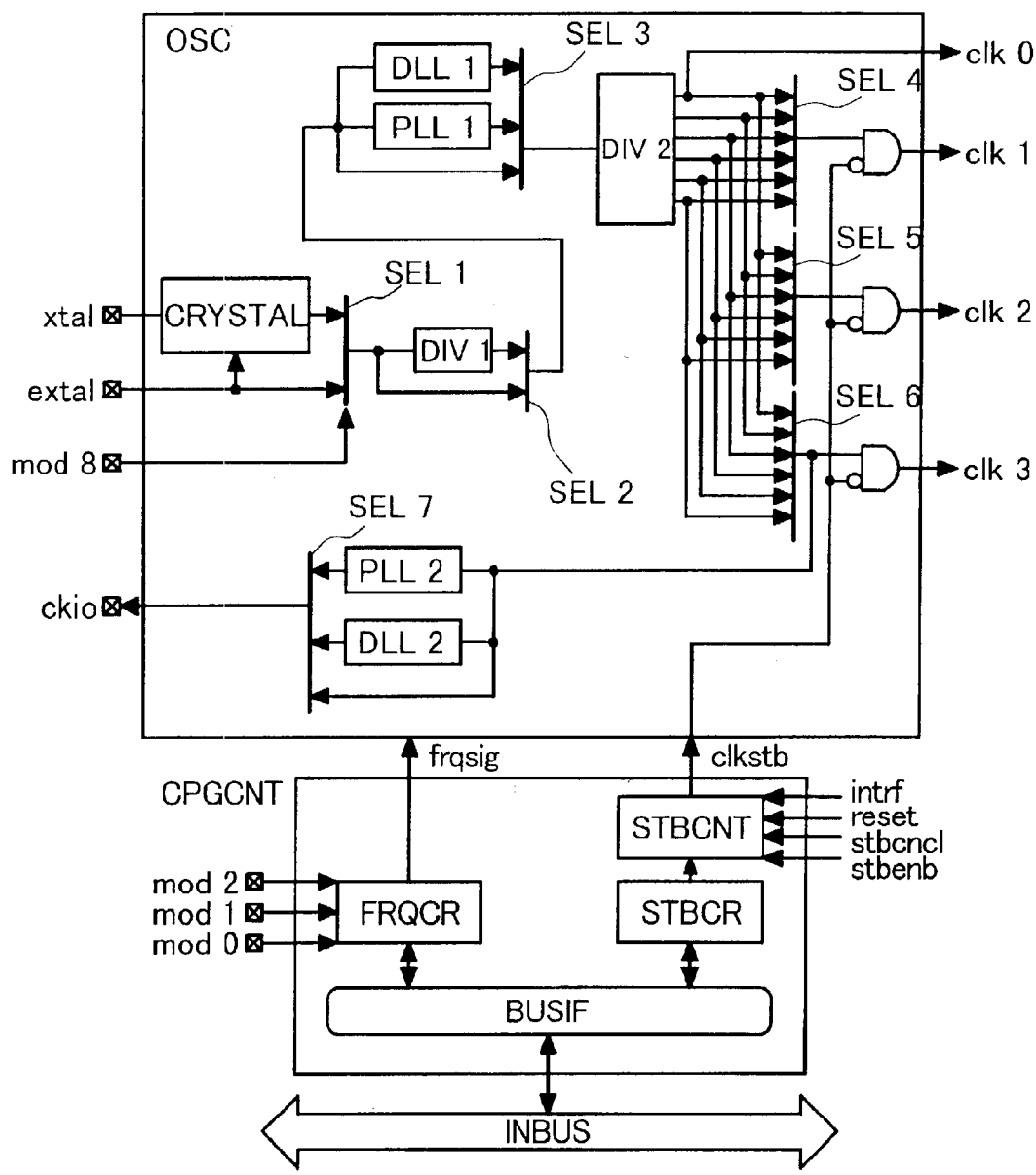
FIG. 14 is a detailed block diagram of the embodiment of FIG. 13.

FIG. 14 is a diagram showing one embodiment of the oscillator OSC and clock control circuit CPGCNT of the embodiment of FIG. 13.

The oscillator OSC, comprises the crystal oscillator circuit CRYSTAL, selector circuits SEL1, SEL2, SEL3, SEL4, SEL5, SEL6, SEL7, frequency dividers DIV1, DIV2, phase-locked loops (PLL) PLL1, PLL2, and delay-locked loops (DLL) DLL1, DLL2. The clock control circuit CPGCNT comprises the frequency control register FRQCR, bus interface BUSIF, standby control register STBCR and standby control circuit STBCNT.

The terminals xta1, exta1 and mod8 are terminals in the oscillator OSC which receive signals from outside the LSI, and xta1 and exta1 are input into the crystal oscillator circuit CRYSTAL. The clock signal output of the crystal oscillator circuit CRYSTAL and the signal from the terminal exta1 are selected by the selector SEL1, and the clock signal clk11 is output. The selection of the selector SEL1 is performed by the terminal mod8, and the clock signal clk11 is divided by the frequency divider DIV1. The clock signal clk11 and the division output signal of the frequency divider DIV1 are selected by the selector SEL2, and the clock signal clk12 is output. The clock signal clk12 is supplied as a reference signal of the PLL PLL1 and DLL DLL1, and synchronized clock signals are respectively generated. The selector SEL3 selects the clock signal clk12 or the clock signal output by the PLL PLL1. The clock signal selected here is divided by the frequency divider DIV2, and is distributed to the LSI as clock signals. The signal divided by the frequency divider DIV2 is obtained as clock signals of desired frequencies by the plural selector circuits SEL4, SEL5, SEL6, and plural clock signals of different frequencies, e.g., the clock signals clk1, clk2 and clk3, are thus supplied to the LSI. One of the clock signals supplied to the LSI, for example clk3, is supplied as a reference signal of the PLL PLL2 and DLL DLL2, and synchronized clock signals are respectively generated. The selector SEL7 selects one output from the clock signal clk3, the clock signal output by the PLL PLL2, and the clock signal output by the DLL DLL2. The clock signal selected here is output outside the LSI from the terminal ckio.

When a crystal resonator is used as a reference clock from outside the LSI, the output from the crystal resonator is applied to the terminal xta1 and terminal exta1, and regulation is performed by the crystal oscillator circuit CRYSTAL. Moreover, when a clock signal is supplied directly from outside, the signal is supplied from the terminal exta1. The selection of the signal due to the crystal resonator and the external clock signal is performed by the selector SEL1. The control of the selector SEL1 is performed by the mode terminal mod8. For example, when the terminal mod8 is High (1), the signal of the crystal resonator is acquired by the oscillator OSC as a reference signal, and when the terminal mod8 is Low (0), the external clock signal is obtained by the oscillator OSC as a reference signal. The two kinds of input signal can be freely changed over using the mode terminal mod8. The clock signal clk11 selected by the selector SEL1 is divided in clock frequency by the frequency divider DIV1. The selector SEL2 selects whether to transmit the clock signal clk11 directly or whether to divide it and then transmit it. The clock signal clk12 selected by the selector SEL2 is supplied to the PLL PLL1 as a reference signal. The selector circuit SEL3 selects the clock signal clk12 directly without passing through the clock generating circuit, or selects the output clock signal of the PLL PLL1 and outputs the clock signal clk13. When phase error does not pose a problem and the external clock signal is input to the LSI as it is, the selector SEL3 transmits the signal directly. When the external clock signal input is multiplied and supplied to the LSI, the output of the PLL PLL1 is selected. The clock signal clk13 is divided in frequency by the frequency divider DIV2, desired frequencies are selected by the selector circuits SEL4, SEL5, SEL, etc., and plural clock signals clk1, clk2, clk3 are thus supplied to the LSI. The combination of the frequency dividers DIV1, DIV2 and the selector circuits SEL2, SEL4, SEL5, SEL6, generates clock signals of plural frequencies which are distributed to the LSI. One of the clock signals distributed to the LSI, for example clk3, is supplied to the PLL PLL2 and DLL DLL2 as a reference signal. The selector SEL7 selects whether to transmit the clock signal clk3 directly without passing through the clock generating circuit, or, to select the clock signal output by the PLL PLL2 or the clock signal output by the DLL DLL2, and outputs the clock signal to the terminal ckio. When phase error does not pose a problem and the clock signal distributed to the LSI is supplied outside the LSI as it is, the selector SEL7 transmits the signal directly. When the clock signal distributed to the LSI and supplied outside the LSI is multiplied, the output of the PLL PLL2 is selected. When the clock signal distributed to the LSI is supplied outside the LSI without multiplying the clock signal, the output of the DLL DLL2 is selected. The clock signal output from the terminal ckio is supplied as a system clock in a system based on a microprocessor comprising this CMOS LSI.

When the CMOS LSI circuit comprising the oscillator OSC generates the clock signal using the PLL PLL1 or PLL2, three kinds of operating state of the LSI internal circuit are provided to save power consumption. The first state is an active state in which normal operation is performed. The second state is a sleep state in which the LSI internal circuit is stopped, and the PLL is operated. The third state is a standby state in which both the LSI internal circuit and PLL are stopped. In the sleep state, as a clock signal is not supplied to the internal circuit, power consumption is reduced, and in the standby state, as the PLL also stops operating, power consumption is further reduced. When the internal circuit returns to the active state from the standby state, the PLL starts operating from the idle state, and after the clock settling time has elapsed, it supplies a clock signal to the internal circuit. As mentioned above, a long time of at least 40 clock signal periods is needed for the clock settling time of the PLL. Hence, to accelerate return from to the active state, the sleep state is provided wherein only the PLL PLL1 and PLL2 are operated, and the internal circuit is stopped. The user of the LSI controls the operating state of the LSI if needed using the operating system (OS) and application software.

When the CMOS LSI circuit comprising the oscillator OSC generates a clock signal using the DLL1 or DLL2, two operating states of the LSI internal circuit are sufficient. As the clock settling time of the DLL is as short as two to three periods, operation can be started from the idle state and a clock signal supplied to the internal circuit rapidly. Therefore, the DLL can be stopped also in the above-mentioned sleep state, and the DLL and LSI internal circuit can be stopped in the sleep state or the standby state. For this reason, power consumption can be reduced compared to the case where the PLL is used. Also, a stable clock signal can be distributed at an early time to the LSI when the LSI circuit starts.

When the CMOS LSI circuit comprising the oscillator OSC generates the clock signal using a PLL and a DLL, for example the PLL1 and DLL2 or the PLL2 and DLL1, three kinds of operating state of the LSI internal circuit are required. During standby, the PLL and DLL stop with the internal circuit, and when there is a return to the active state, a clock settling time is required until the PLL assumes stable operation. In the sleep state, only the PLL is operated, and the DLL and internal circuit can be stopped. In this case, a return to the active state can be made at high speed.

The clock control circuit CPGCNT receives a clock control command from the internal bus INBUS of the LSI circuit, control signals are input from the mode terminals mod0, mod1, mod2, etc., the frequency control signal frqsig is output, the selection of the selector circuits SEL2, SEL3, SEL4, SEL5, SEL6, SEL7 in the oscillator OSC is determined, and the PLL PLL1, PLL2 or DLL DLL1, DLL2 and the division ratio of the frequency divider are selected. In the clock control circuit CPGCNT, the bus interface BUSIF decodes the clock control command from the internal bus INBUS, and the frequency control register FRQCR is rewritten. Alternatively, a signal is input from the mode terminals mod0, mod1, mod2, etc., and the frequency control register FRQCR is rewritten. The frequency control signal frqsig outputs a signal according to the setting of the frequency control register FRQCR, and selects the selector circuit of the oscillator OSC. In this way, the clock generating circuit PLL1, PLL2 or DLL1, DLL2 in the oscillator OSC can be selected by sending a command to the internal bus INBUS in the CMOS LSI circuit using the control signal to the mode terminal from outside, and the operating system or application software, and the frequency of the clock signal distributed to the LSI can be determined. The rewriting of the frequency register FRQCR by the control signal of the mode terminal may be performed only when the CMOS LSI circuit starts, and rewriting performed by the control command from the internal bus in other cases.

The clock control circuit CPGCNT also receives a standby control command from the internal bus INBUS of the LSI circuit via the bus interface BUSIF command and rewrites the standby control register STBCR. The standby control circuit STBCNT inputs the output of the standby control register STBCR and the interrupt signal intrf, reset signal reset, standby enable signal stbenb and standby cancel signal stbcncl, controls the operation of the clock signal generating circuits PLL1, PLL2, DLL1, DLL2 in the oscillator OSC, and controls the output of the clock signal distributed to the LSI. When the LSI internal circuit enters the standby state, all of the clock generating circuits PLL1, PLL2, DLL1, DLL2 stop and the clock output signal also stops due to the clock standby signal CLKSTB, and power consumption is reduced. When the LSI internal circuit enters the sleep state, if the PLL1 or PLL2 of the clock generating circuits is used, operation is continued, and if the DLL1 or DLL2 is used, operation stops and output of all clock signals from generating circuits stops. When the LSI internal circuit returns to the active state from the standby state or sleep state, the clock generating circuits PLL1, PLL2, DLL1, DLL2 start operating, the standby cancel signal stbcncl is asserted after the clock settling times required by the respective clock generating circuits have elapsed, and a clock signal is output from the oscillator OSC. In this way, when the LSI internal circuit is in the standby or sleep state, power consumption is reduced, and when it returns to the active state, incorrect operation of the LSI internal circuit is prevented by supplying a clock signal after the clock generating circuit has stabilized. When the DLL circuit is used, return to the active state can be made at high speed.

Figures 15, 16:
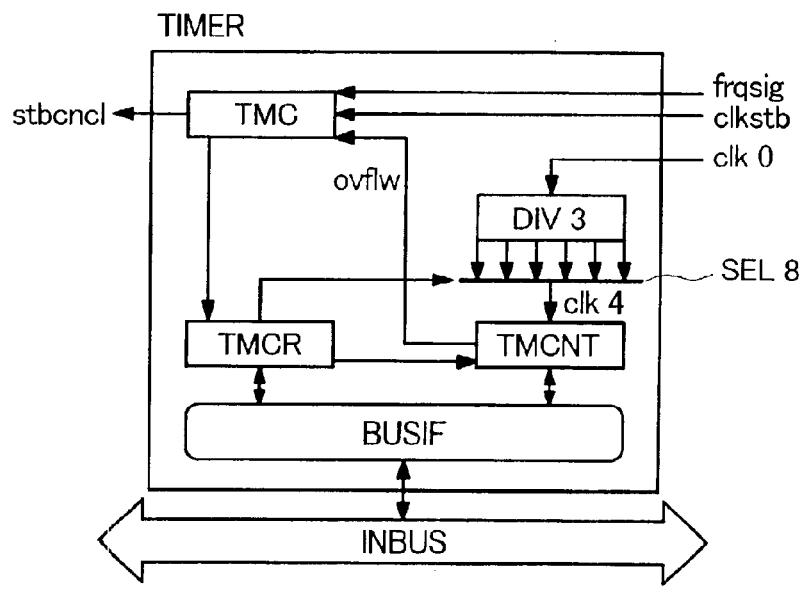
FIG. 15 is a detailed block diagram of the embodiment of FIG. 13.
FIG. 16 is a drawing showing a setting of a frequency control register.

FIG. 15 is a diagram showing an embodiment of the timer circuit TIMER in the embodiment of FIG. 13.

The timer comprises a timer control circuit TMC, timer control register TMCR, timer counter TMCNT, divider DIV3, selector circuit SEL8 and bus interface BUSIF. The frequency control signal frqsig and clock standby signal clkstb are input to the timer control circuit TMC, and when the frequency of the clock generating circuit controlled by the frequency control signal frqsig changes or when the operating state of the LSI internal circuit changes and the clock standby signal clkstb also changes, the change is transmitted to the timer control register TMCR. As a result, the timer control register TMCR starts the timer counter TMCNT counting. The control command from the internal bus INBUS is decoded in the bus interface BUSIF, rewrites the timer control register TMCR and selects the selector circuit SEL8. The output of the bus interface BUSIF also changes the initial value of the timer counter TMCNT. Due to the above two settings, the time counted by the timer counter TMCNT is determined. The clock signal clk0 supplied from the oscillator OSC is frequency-divided in the divider DIV3, and the signal selected by the selector circuit SEL8 becomes a clock signal clk4 which counts the timer counter TMCNT. When counting of the timer counter TMCNT is finished, an overflow signal is output, and the timer control circuit TMC asserts the standby cancel signal stbcncl. Due to the above process, the timer circuit supplies the clock signal stably when the clock generating circuit varies the frequency or when there is a return from the standby or sleep state to the active state, and incorrect operation of the system is prevented.

The process of returning to the active state from the standby state will now be described in detail referring to FIGS. 13, 14 and 15. The return is performed by the interrupt signal intrf or reset signal reset. When one of these signals is input to the standby control circuit STBCNT, one of the clock generating circuits PLL1, PLL2, DLL1, DLL2 in the oscillator OSC which is selected by the frequency control signal frqsig starts operating. At this time, the oscillator OSC starts outputting the clock signal clk0. The clock standby signal clkstb is input also to the timer control circuit TMC in the timer circuit TIMER, the timer control register is rewritten, and counting by the timer counter TMCNT is started. The timer counter TMCNT performs counting according to the clock signal clk0. The initial value of the count is supplied via the internal bus INBUS. For example, when a PLL is used it is set to count 40 or more periods, and when only a DLL is used, it is set to count three periods. During a return from the sleep state to the active state, when a PLL is used, the PLL continues operating so the count is set to 0. When the count is finished, the timer counter TMCNT outputs an overflow signal ovflw, and the timer control circuit TMC receives this signal and asserts the standby cancel signal stbcncl. Due to assertion of the standby cancel signal stbcncl, the standby control circuit STBCNT in the clock control circuit CPGCNT outputs the clock signals clk1, clk2, clk3, clkio from the oscillator OSC using the clock standby signal. In this way, the clock signal output from the oscillator OSC is supplied after the clock generating circuits are able to output stable signals which coincide in frequency and phase with desired values after the clock settling time has elapsed, and incorrect operation of the LSI internal circuit or system is prevented.

FIG. 16 is a diagram showing an embodiment of the frequency control register setting.

Assume that the frequency control register FRQCR is 16-bit, for example. If three types of clock signal are distributed to the LSI, and the frequency of the clock signal is determined by three bits, 14 bits are used. Bit 13 is a clock output enable bit CKOEN which outputs or stops the clock signal. Bits 12, 11, 10, 9 are respectively enable bits which determine operation or stop of the clock generating circuits PLL1, PLL2, DLL1, DLL2, for example, PLL1 and DLL1, or PLL2 and DLL2, do not operate simultaneously. Bit 8 to bit 0 are bits which determine the division ratios of the output clock signal. These division ratios may be set as in the embodiments shown in FIGS. 19, 20 and 21. In the case of the register setting of FIG. 16, a clock operation initialization is first provided, and the operation is modified by rewriting the register.

FIG. 17 is a diagram showing another embodiment of the frequency control register setting.

The contents of the frequency control register FRQCR are identical to those of the register of FIG. 16. In the case of the register setting of FIG. 17, some initial settings of clock operation may not have been provided, and any setting not provided which in the figure is the division ratio of the output clock signal, is set by obtaining a control signal from outside via the mode terminals mod0, mod1, mod2. During reset, the setting from the mode terminals is used, and during operation, the register may be rewritten by a control command from the internal bus. FIG. 22 shows an embodiment of the setting of the mode terminals.

FIG. 18 is a diagram showing another embodiment of the frequency control register setting.

The clock settling time is different in the PLL and DLL. As a result, it may occur that the register has to be rewritten twice to set the respective clock settling times in one frequency control register FRQCR. In such a case, if plural frequency control registers are provided, such as FRQCR1 and FRQCR2, and the operation settings of the PLL and DLL are performed by different registers, the registers need to be updated only once.

FIG. 23 is a diagram showing an embodiment of the timer control register setting.

If the timer control register is 8 bits, for example, the setting may be made as in the diagram. Bit 7 is a time enable bit which commands start of the timer counter TMCNT. Bit 3 is a timer overflow bit which notifies that counting by the timer counter has completed. Bits 2 to 0 select the frequency division ratios of the clock signals input to the timer counter TMCNT.

FIG. 24 is a diagram showing an embodiment of the timer counter setting.

If the timer counter TMCNT is 8 bits, counting can be performed up to $2^8$ periods. The count period is determined by the initial value of the timer counter TMCNT and the frequency of the clock signal input to the timer counter TMCNT.

FIG. 25 is a diagram showing an embodiment of the standby control register setting.

When there are three operating states of the LSI, i.e., active, sleep and standby, a 2 bit register is used. Bit 1 is a bit which selects the sleep state, and bit 0 is a bit which selects the standby state. If neither bit is selected, the system is in the active state.

As described hereabove, this invention offers the following attendant benefits and advantages. The invention provides a semiconductor integrated circuit device comprising a clock generating circuit having a short clock settling time. The clock generating circuit can also be stopped when the operation of the internal circuit of the semiconductor integrated circuit device is stopped to reduce power consumption, and when the operation of the internal circuit is returned to the normal operating state, the clock generating circuit can rapidly generates a clock signal. Therefore, power consumption can be saved when the internal circuit is in the operating state, and operation of the internal circuit can be restored at high speed.

What is claimed is:

1. A semiconductor integrated circuit device comprising:

a first clock signal generating circuit which receives a reference clock and outputs a first clock signal, wherein the first clock signal is phase-synchronized with the reference clock and has a frequency which is a multiple or a fraction of a frequency of the reference clock;

a second clock signal generating circuit which receives the reference clock and outputs a second clock signal, wherein the second clock signal is phase-synchronized with the reference clock and has a frequency which is a fraction of the frequency of the reference clock;

a selector which selects one of the first clock signal and the second clock signal; and a clock control circuit which specifies whether the first clock signal or the second clock signal should be selected by the selector, wherein one of the first clock signal and the second clock signal selected by the selector is distributed to an internal circuit of the semiconductor integrated circuit device, wherein the first clock signal generating circuit takes a longer clock-settling time than the second clock signal generating circuit, wherein the clock control circuit includes a register which sets an operating state of the first clock signal generating circuit and an operating state of the second clock signal generating circuit, and the register is updated from outside of the semiconductor integrated circuit device, and wherein the semiconductor integrated circuit device can be in at least three states when the selector selects the first clock signal and the semiconductor integrated circuit device can be in at least two states when the selector selects the second clock signal.

2. The semiconductor integrated circuit device according to claim 1, wherein the semiconductor integrated circuit device can be in one of a first state, a second state and a third state when the selector selects the first clock signal, in which (i) in the first state, the first clock signal generating circuit operates and the first clock signal is distributed to the internal circuit, (ii) in the second state, the first clock signal generating circuit operates and the first clock signal is not distributed to the internal circuit and (iii) in the third state, the first clock signal generating circuit does not operate.

3. The semiconductor integrated circuit device according to claim 2, wherein the semiconductor integrated circuit device can be in one of a fourth state and a fifth state when the selector selects the second clock signal, in which (iv) in the fourth state, the second clock signal generating circuit operates and the second clock signal is distributed to the internal circuit, and (v) in the fifth state, the second clock signal generating circuit does not operate.

4. The semiconductor integrated circuit device according to claim 3, wherein the first clock signal generating circuit is a phase-locked loop circuit and the second clock signal generating circuit is a delay-locked loop circuit.

5. A clock distributing method comprising:

providing a semiconductor integrated circuit device to include a first clock signal generating circuit for outputting a first clock signal, a second clock generating circuit for outputting a second clock signal and a register for setting an operating state of the first clock signal generating circuit and an operating state of the second clock signal generating circuit, a clock-settling time of the first clock signal generating circuit being longer than a clock-settling time of the second clock signal generating circuit;

setting the register from outside of the semiconductor integrated circuit device; and distributing one of the first clock signal and the second clock signal to an internal circuit of the semiconductor integrated circuit device, based on selection by the register, wherein when setting the register to select the first clock signal, the semiconductor integrated circuit device is settable to one of a first state, a second state and a third state, in which (i) in the first state, the first clock signal generating circuit operates and the first clock signal is distributed to the internal circuit, (ii) in the second state, the first clock signal generating circuit operates and the first clock signal is not distributed to the internal circuit, and (iii) in the third state, the first clock signal generating circuit does not operate.

6. The clock distributing method according to claim 5, wherein:

when setting the register to select the second clock signal, the semiconductor integrated circuit device is settable to one of a fourth state and a fifth state, in which (iv) in the fourth state, the second clock signal generating circuit operates and the second clock signal is distributed to the internal circuit, and (v) in the fifth state, the second clock signal generating circuit does not operate.

* * * * *